(12) United States Patent
Ye et al.

(10) Patent No.: US 7,115,517 B2
(45) Date of Patent: Oct. 3, 2006

(54) METHOD OF FABRICATING A DUAL DAMASCENE INTERCONNECT STRUCTURE

(75) Inventors: Yan Ye, Saratoga, CA (US); Xiaoye Zhao, Mountain View, CA (US); Hong Du, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 298 days.

(21) Appl. No.: 10/674,700

(22) Filed: Sep. 29, 2003

(65) Prior Publication Data

US 2004/0198062 A1 Oct. 7, 2004

Related U.S. Application Data

(60) Provisional application No. 60/460,940, filed on Apr. 7, 2003.

(51) Int. Cl.
*H01L 21/302* (2006.01)
*H01L 21/3065* (2006.01)

(52) U.S. Cl. .............. 438/700; 438/706; 438/725; 252/79.1; 216/41

(58) Field of Classification Search ............. 438/700, 438/706, 725; 252/79.1; 216/41
See application file for complete search history.

(56) References Cited

U.S. PATENT DOCUMENTS

| 5,882,996 A * | 3/1999 | Dai ........................ 438/597 |
| 5,935,762 A * | 8/1999 | Dai et al. ................. 430/312 |
| 5,985,762 A * | 11/1999 | Geffken et al. ............ 438/687 |
| 6,436,810 B1 * | 8/2002 | Kumar et al. .............. 438/633 |
| 6,514,672 B1 | 2/2003 | Young et al. .............. 430/314 |
| 6,524,950 B1 * | 2/2003 | Lin ........................... 438/644 |
| 6,576,545 B1 * | 6/2003 | Hopper et al. ............. 438/624 |
| 6,743,732 B1 * | 6/2004 | Lin et al. .................. 438/706 |
| 6,809,028 B1 * | 10/2004 | Chen et al. ................ 438/637 |
| 2001/0046632 A1 | 11/2001 | Young et al. ................ 430/5 |

OTHER PUBLICATIONS

Mahorowala, et al., "Transfer Etching of Bilayer Resists in Oxygen-based Plasmas," Journal of Vacuum Science & Technology A: Vacuum, Surfaces, and Films 18 (4), 1411-1419 (Jul. 2000).

* cited by examiner

*Primary Examiner*—Nadine Norton
*Assistant Examiner*—Lynette T. Umez-Eronini
(74) *Attorney, Agent, or Firm*—Moser IP Law Group

(57) ABSTRACT

A method of fabricating an interconnect structure (e.g., dual damascene interconnect structure, and the like) of an integrated circuit device is disclosed. The interconnect structure is fabricated using a bi-layer mask comprising an imaging film and an organic planarizing film. The bi-layer mask is used to remove lithographic misalignment between a contact hole, a trench, and an underlying conductive line when the interconnect structure is formed. Additionally, a sacrificial layer may be used to protect an inter-metal dielectric (IMD) layer during subsequent planarization of the interconnect structure. The sacrificial layer may be formed of amorphous silicon (Si), titanium nitride (TiN), tungsten (W), and the like. The interconnect structure may be formed of a metal (e.g., copper (Cu), aluminum (Al), tantalum (Ti), tungsten (W), titanium (Ti), and the like) or a conductive compound (e.g., tantalum nitride (TaN), titanium nitride (TiN), tungsten nitride (WN), and the like).

21 Claims, 17 Drawing Sheets

METHOD OF FABRICATING A DUAL DAMASCENE INTERCONNECT STRUCTURE

CROSS REFERENCE TO RELATED APPLICATIONS

This application claims benefit of U.S. provisional application Ser. No. 60/460,940, filed Apr. 7, 2003, which is herein incorporated by reference.

BACKGROUND OF THE INVENTION

1. Field of the Invention

The present invention generally relates to fabrication of semiconductor integrated circuits. More specifically, the present invention relates to a method of fabricating interconnect structures in a semiconductor substrate processing system.

2. Description of the Related Art

Integrated circuits (IC) are manufactured by forming discrete semiconductor devices on a surface of a semiconductor substrate, such as a silicon (Si) wafer. A multi-level network of interconnect structures is then formed to interconnect the devices. Copper (Cu) is the wiring material of choice for interconnect structures of advanced IC devices having a high circuit density. In addition to superior electrical conductivity, copper is more resistant than aluminum (Al) to electromigration, a phenomenon that may destroy a thin film conductive line during IC operation.

In the semiconductor industry, much effort is spent in developing smaller IC devices with ever-increasing operating speeds. To increase the circuit density, a dual damascene technique may be used during fabrication of the IC devices. Then, to increase the operating speed of such a device, inter-metal dielectric (IMD) layers are formed using materials having dielectric constants less than 4.0. Such materials are generally referred to as low-k materials. The low-k materials generally comprise carbon-doped dielectrics, such as organic doped silicon glass (OSG), fluorine doped silicon glass (FSG), organic polymers, and the like.

An IC device comprises a plurality of interconnect structures that are separated from each other and the substrate by the IMD layers. Such structures are generally fabricated using a dual damascene technique that comprises forming an insulator layer (e.g., IMD layer) into which trenches and openings are etched to pattern the contact vias and the conductive lines. The copper is then used to fill (metallize) the trenches and openings in the IMD layer, forming vias and conductive lines, respectively. During the copper metallization process, an excess amount of copper may be deposited onto the substrate. The excess metal may be removed using a planarization process, e.g., chemical-mechanical polishing (CMP) process. After the planarization process, the next wiring layer may be formed on top of the IMD layer.

During fabrication of the interconnect structure, lithographic errors may result in misalignment between the positions of a contact hole and a trench of the structure. Additionally, mechanical stress, as well as chemically aggressive agents used during the planarization process, may cause the material of the IMD layer to erode, crack, or peel off. Such defects may render the interconnect structure to operate sub-optimally or not at all.

Therefore, there is a need in the art for an improved method of fabricating a dual damascene interconnect structure.

SUMMARY OF THE INVENTION

The present invention is a method of fabricating an interconnect structure (e.g., dual damascene interconnect structure, and the like) of an integrated circuit device. The interconnect structure is fabricated using a bi-layer mask comprising an imaging layer (e.g., a photoresist film or a silicon-rich photoresist film) and an organic planarizing film. The bi-layer mask removes lithographic misalignment between a contact hole, a trench, and an underlying conductive line when the interconnect structure is formed. Additionally, a sacrificial layer may be used to protect an inter-metal dielectric (IMD) layer during subsequent planarization of the interconnect structure. The sacrificial layer may be formed of a dielectric material (e.g., amorphous silicon (Si), and the like) or a metallic layer (e.g., titanium nitride (TiN), tungsten (W), and the like). The interconnect structure may be formed of a metal (e.g., copper (Cu), aluminum (Al), tantalum (Ta), tungsten (W), titanium (Ti), and the like) or a conductive compound (e.g., tantalum nitride (TaN), titanium nitride (TiN), tungsten nitride (WN), and the like).

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

It is to be noted, however, that the appended drawings illustrate only exemplary embodiments of this invention and are therefore not to be considered limiting of its scope, for the invention may admit to other equally effective embodiments.

DETAILED DESCRIPTION

The present invention is a method of fabricating an interconnect structure on a substrate (e.g., a silicon (Si) wafer) using a bi-layer mask to pattern a contact hole or a trench in an inter-metal dielectric (IMD) layer of the interconnect structure. The method additionally removes lithographic misalignment between the contact hole, the trench, and an underlying conductive line. In one embodiment, the invention is used to fabricate a dual damascene copper interconnect structure.

Figure 1A:
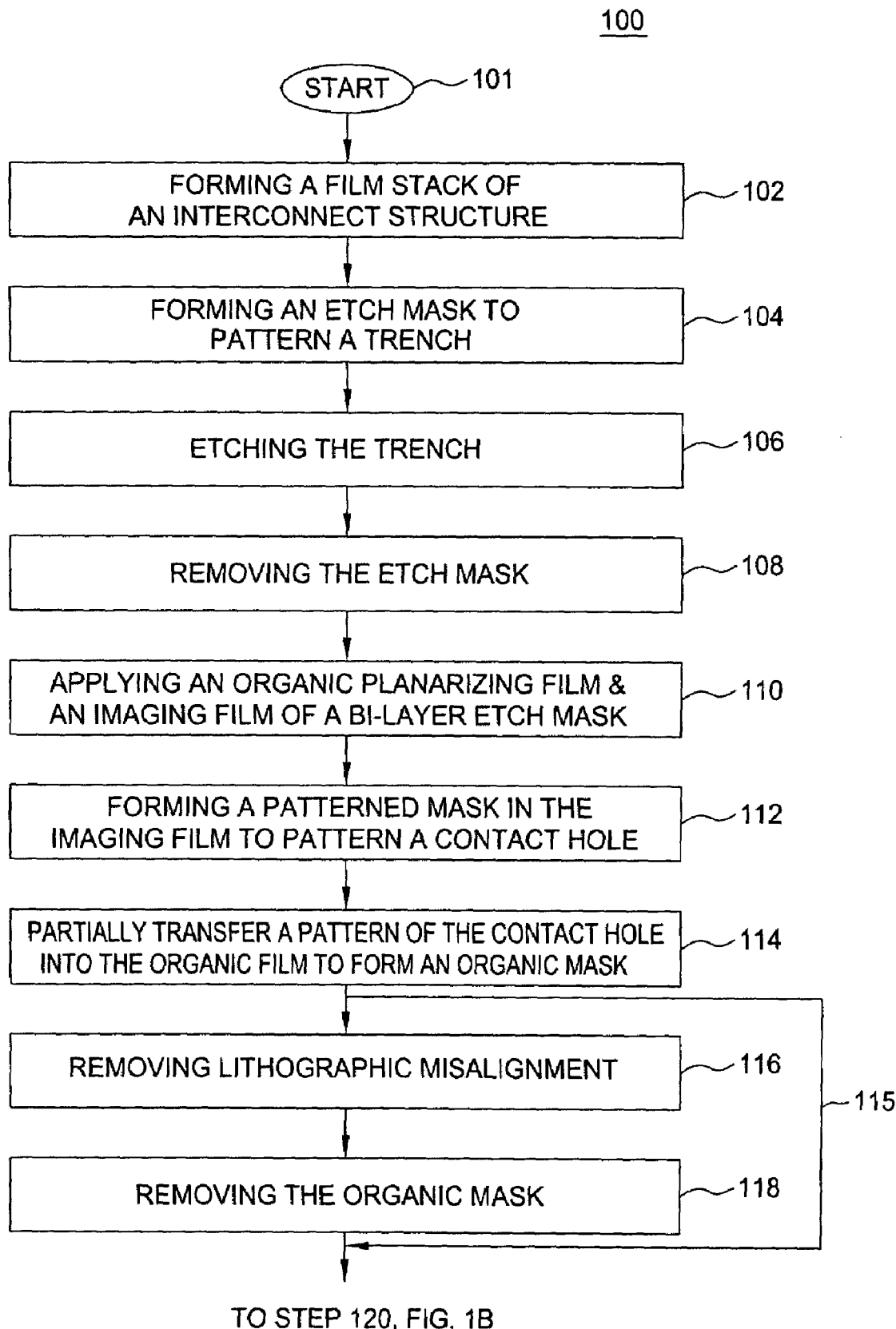
FIGS. 1A–1B depict a flow diagram of a method of fabricating a dual damascene interconnect structure in accordance with one embodiment of the present invention.
Figure 1B:
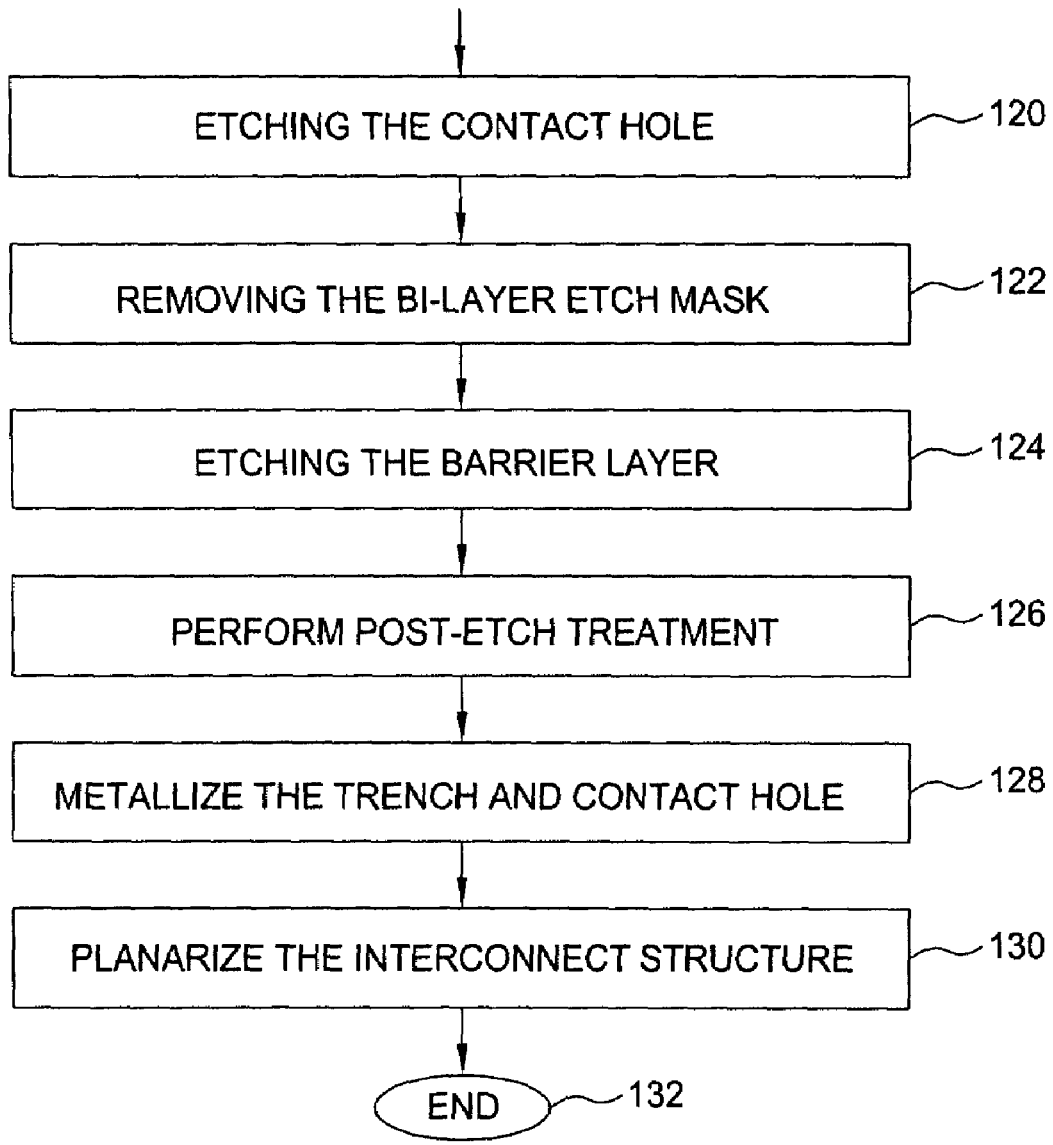

FIGS. 1A–1B depict a flow diagram of one embodiment of the inventive method for fabricating a dual damascene interconnect structure as a sequence 100. The sequence 100 comprises the processes that are performed upon a film stack during fabrication of the dual damascene interconnect structure.

Figure 2A:
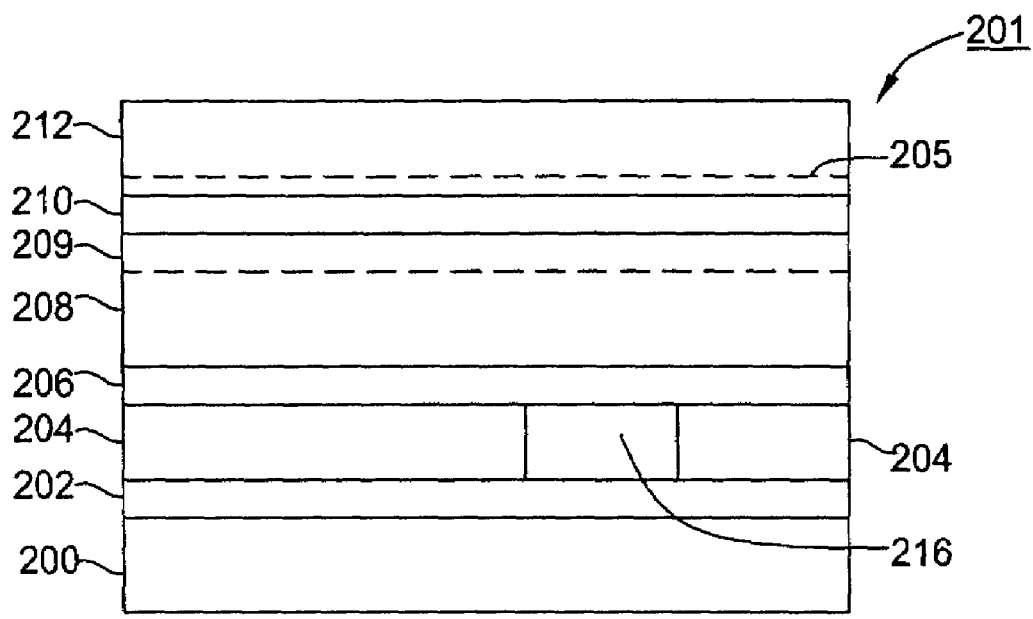
FIGS. 2A–2N depict a sequence of schematic, cross-sectional views of a substrate having a damascene interconnect structure being formed in accordance with the method of FIGS. 1A–1B.
Figure 2B:
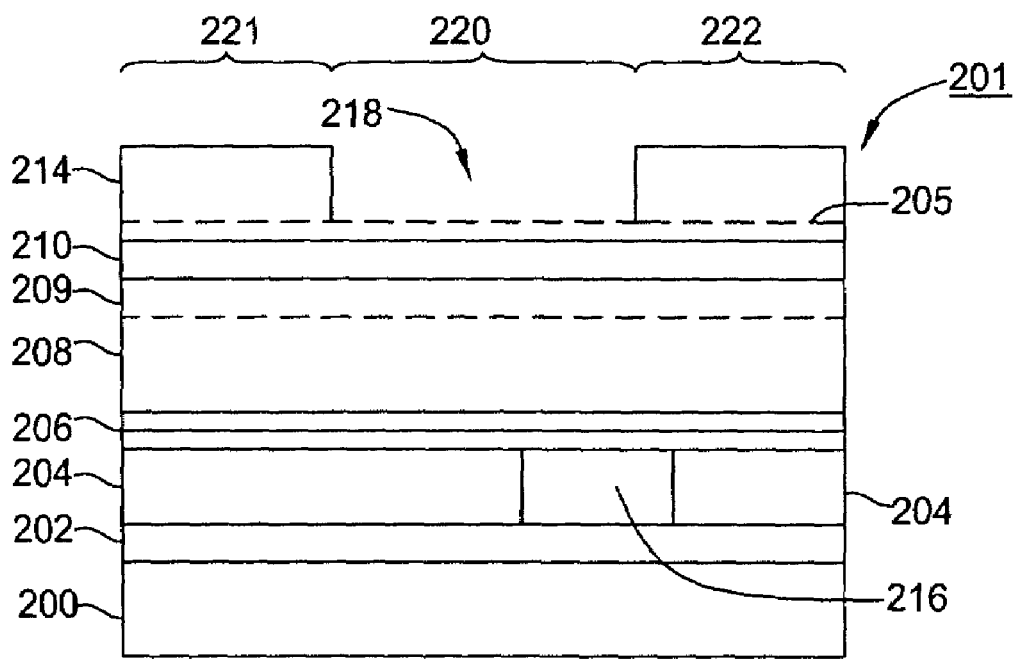
Figure 2C:
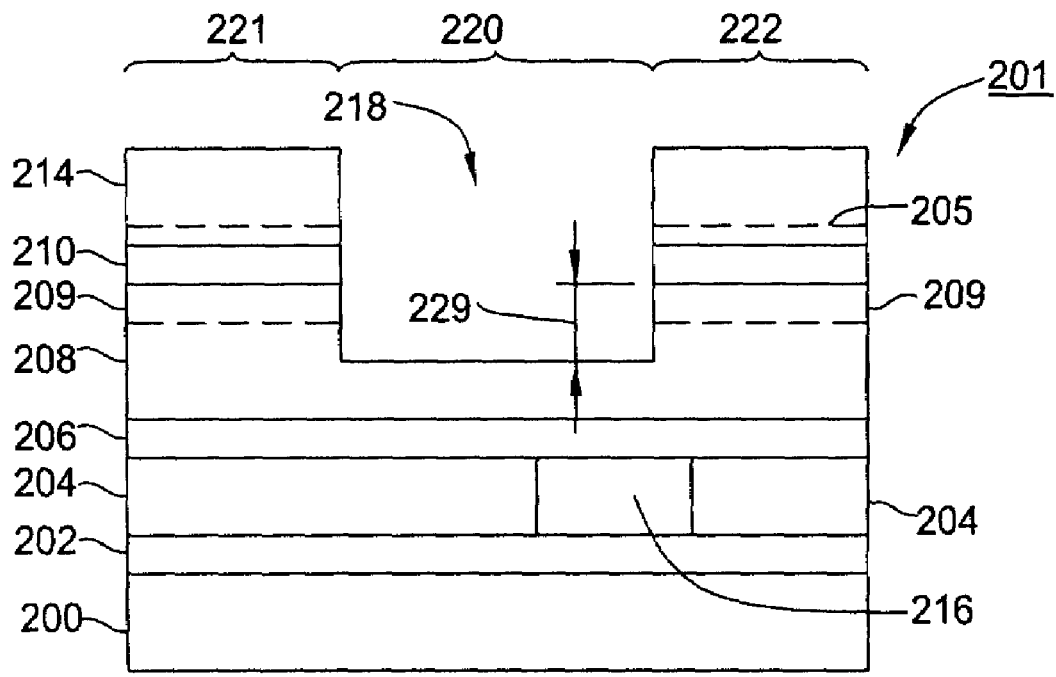
Figure 2D:
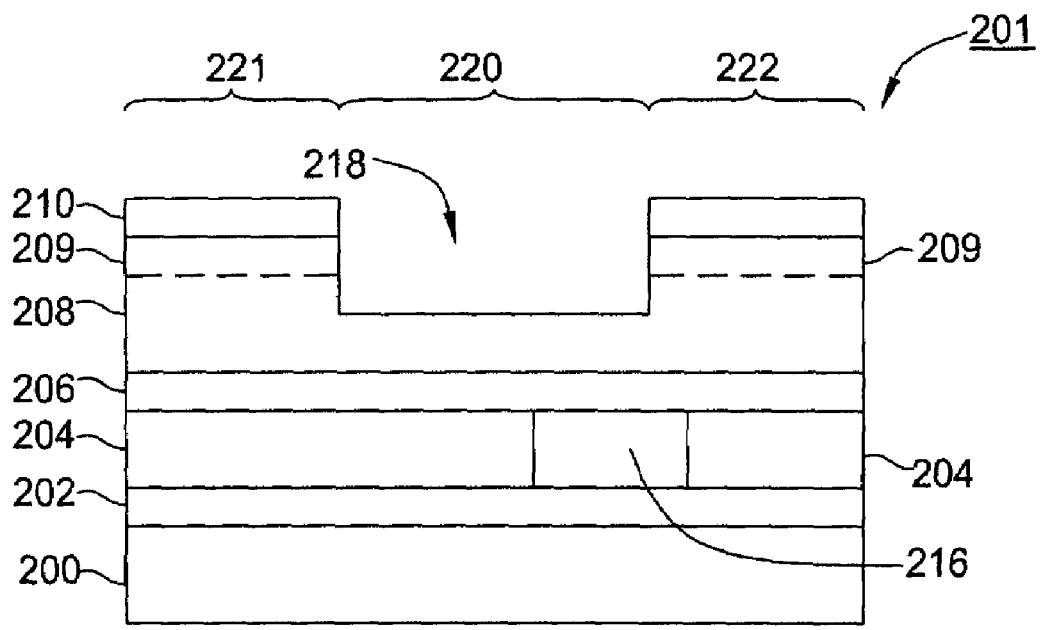
Figure 2E:
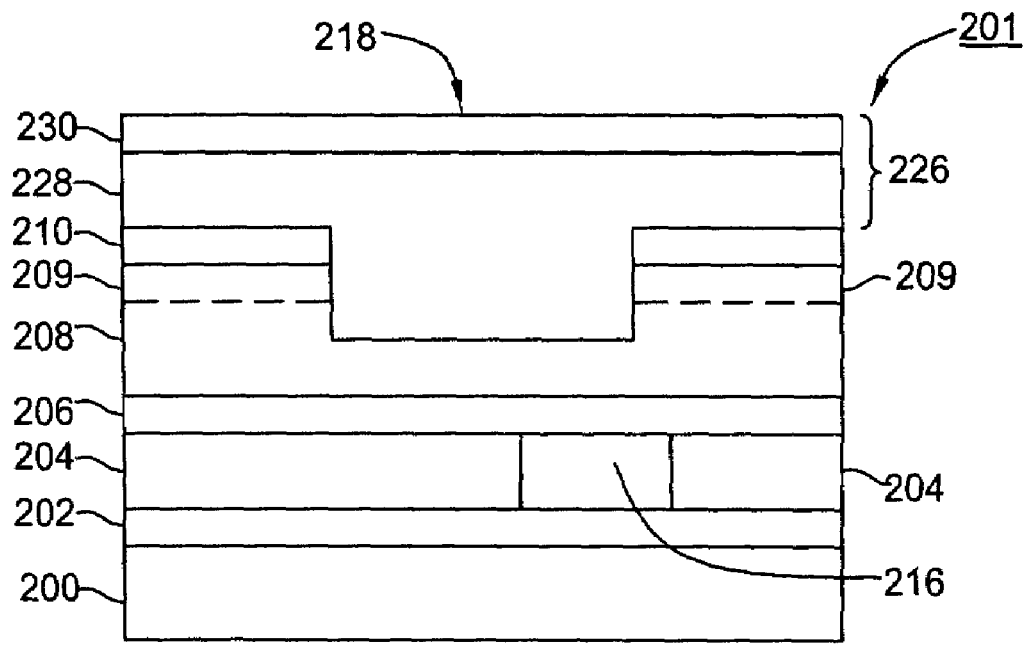
Figure 2F:
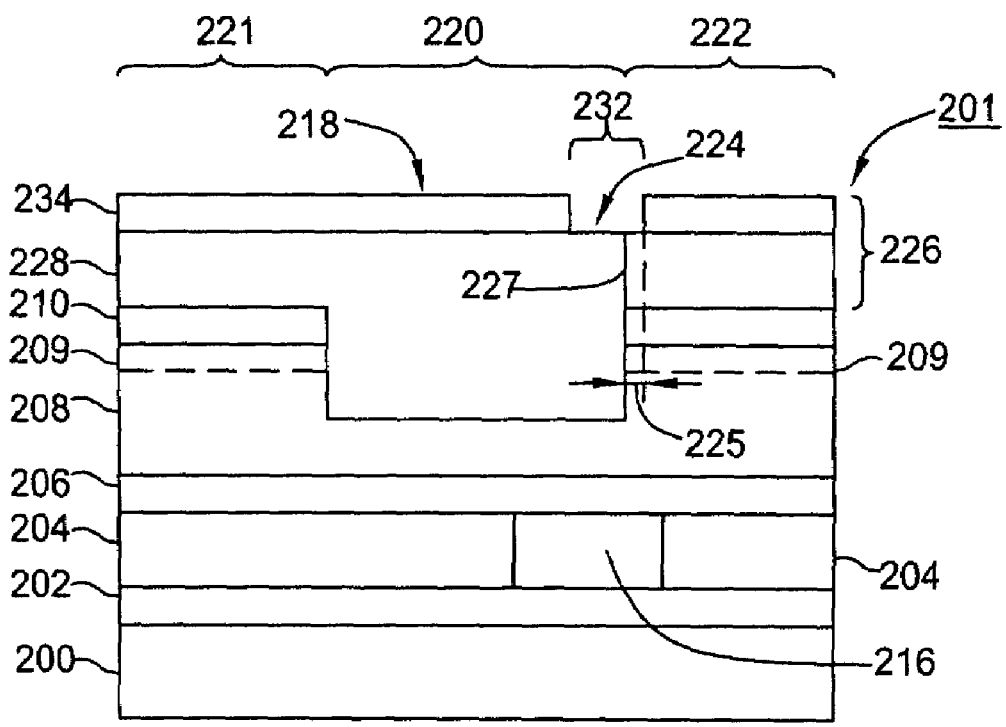
Figure 2G:
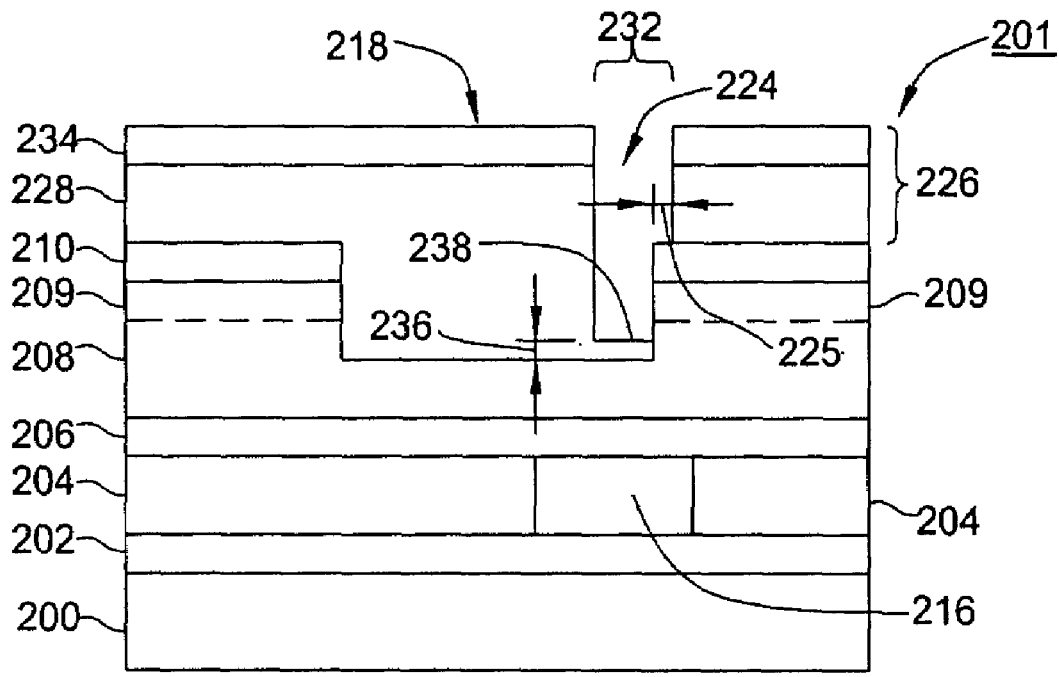
Figure 2H:
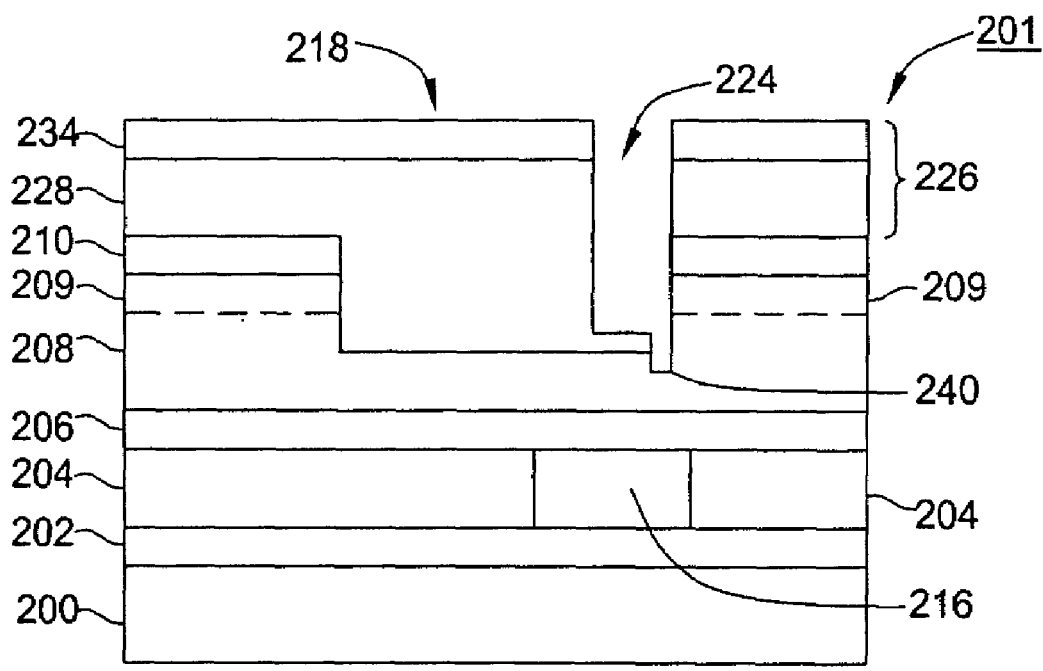
Figure 2I:
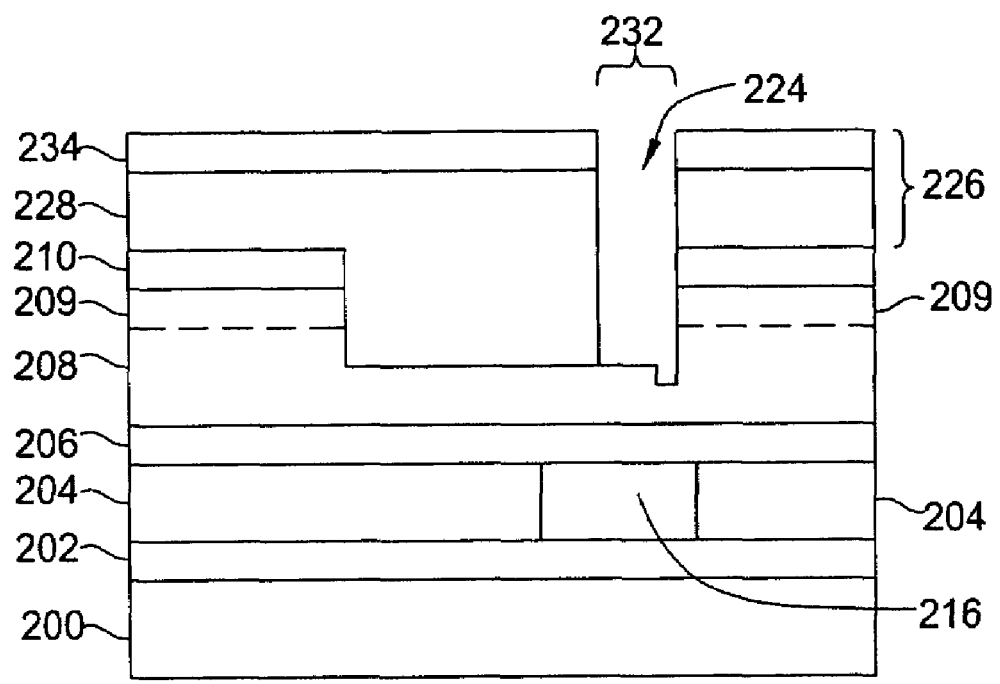
Figure 2J:
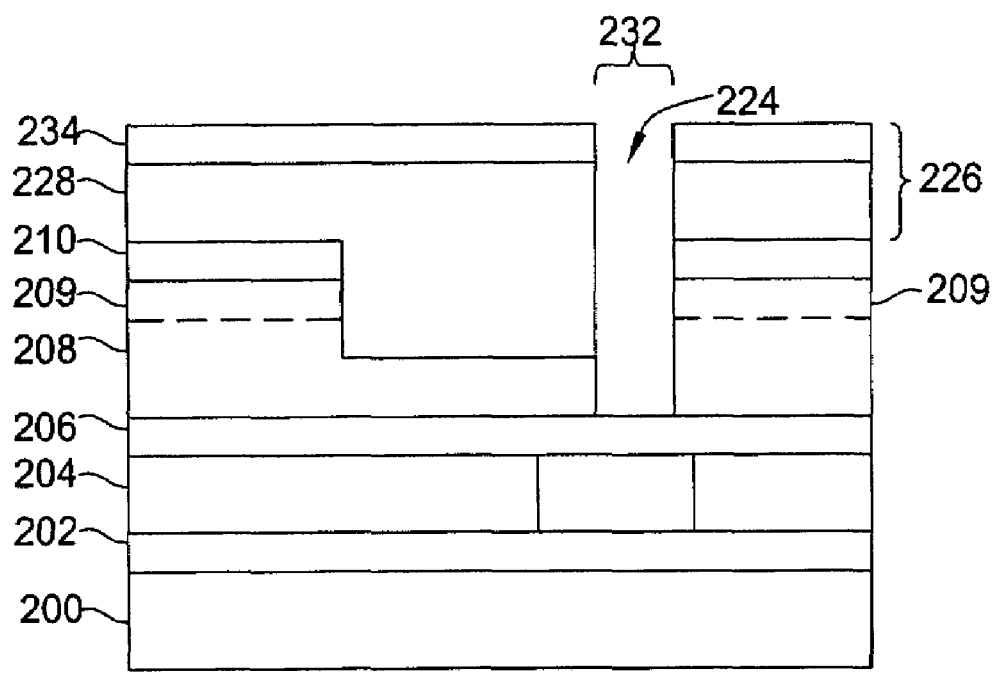
Figure 2K:
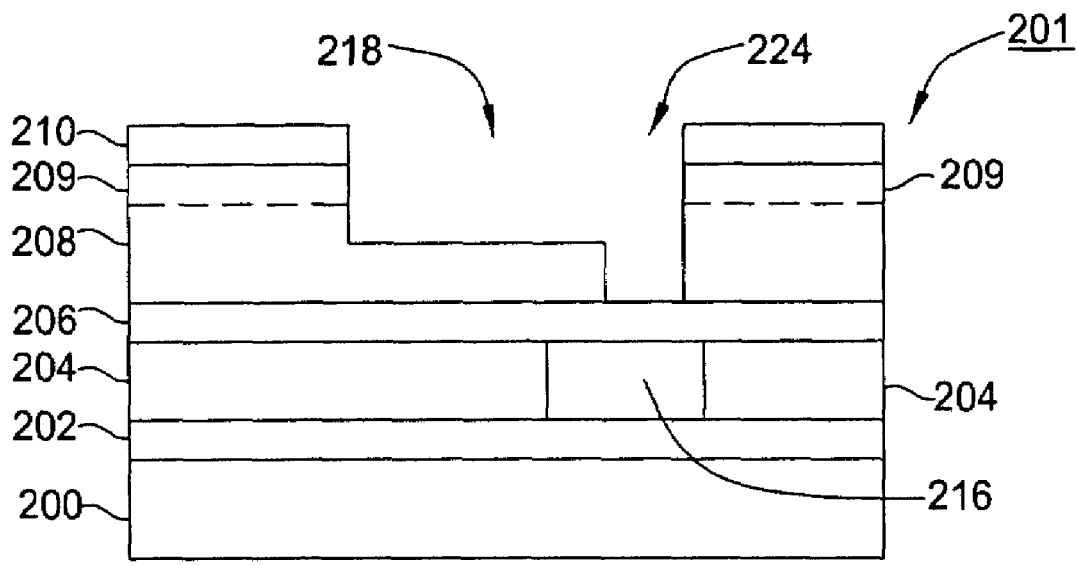
Figure 2L:
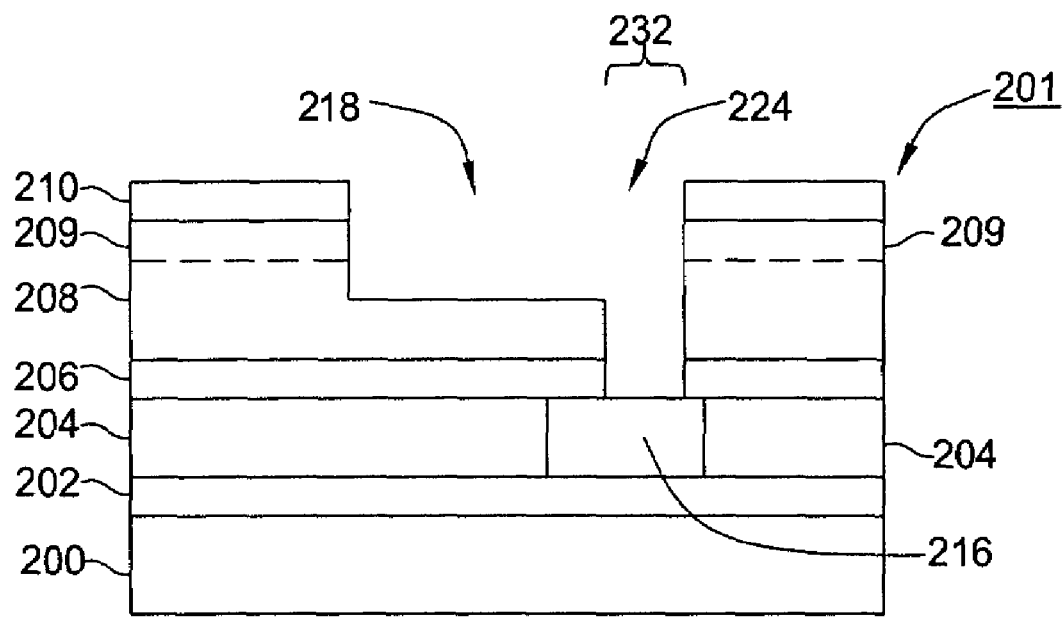
Figure 2M:
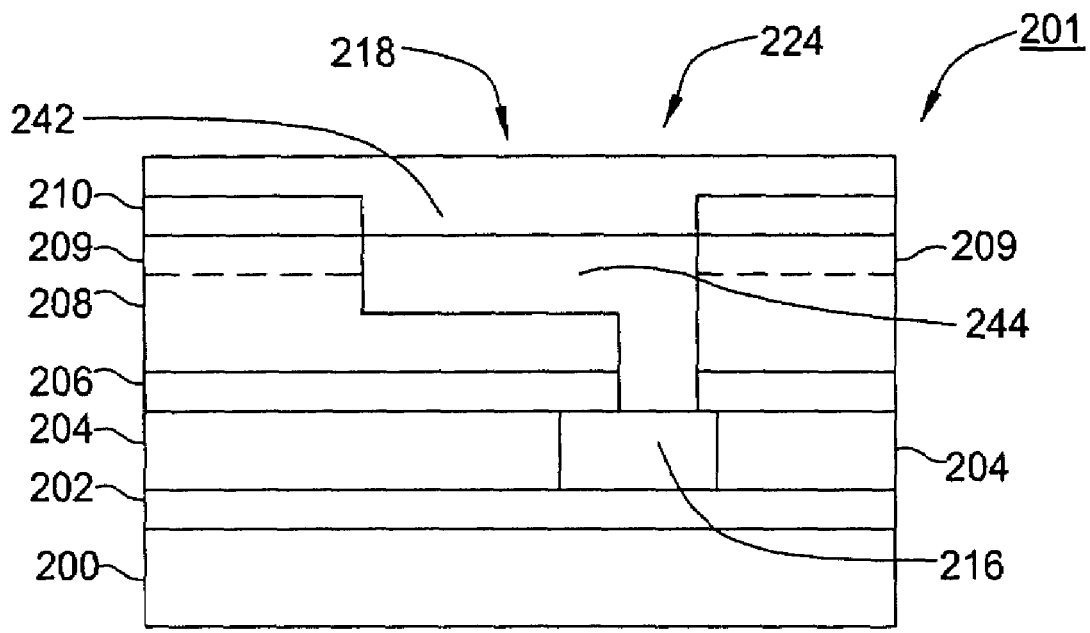
Figure 2N:
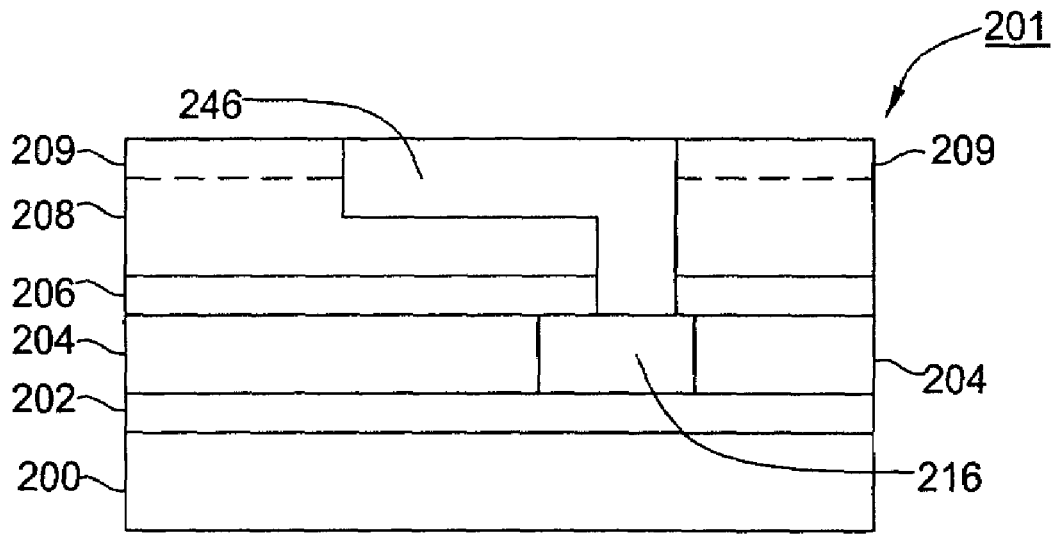

FIGS. 2A–2N depict a sequence of schematic, cross-sectional views of a substrate having a dual damascene interconnect structure being fabricated using the sequence 100. The cross-sectional views in FIGS. 2A–2N relate to individual processing steps used to fabricate the interconnect structure. To best understand the invention, the reader should simultaneously refer to FIGS. 1A–1B and FIGS. 2A–2N. Sub-processes and lithographic routines (e.g., exposure and development of photoresist, wafer cleaning procedures, and the like) are well known in the art and, as such, are not shown in FIGS. 1A–1B and FIGS. 2A–2N. The images in FIGS. 2A–2N are not depicted to scale and are simplified for illustrative purposes.

The sequence 100 starts at step 101 and proceeds to step 102 when a film stack 201 of a dual damascene interconnect structure is formed on a wafer 200 (e.g., silicon wafer) (FIG. 2A). In one illustrative embodiment, the film stack 201 comprises a first barrier layer 202, a first dielectric layer 204 including an embedded conductive line 216, a second barrier layer 206, a second dielectric layer 208, a sacrificial layer 210 and a mask 212. A capping layer 209 (shown in broken lines) may be formed on the second dielectric layer 208 prior to the sacrificial layer 210.

The first barrier layer 202 is generally formed to a thickness of about 300 to 1000 Angstroms from a dielectric material, such as silicon dioxide ($SiO_2$), silicon nitride ($Si_3N_4$), silicon carbide (SiC), and the like. The second barrier layer 206 may be formed, e.g., from a silicon carbide (SiC) material such as, BLOK-II™ or BLOK-III™, available from Applied Materials, Inc. of Santa Clara, Calif. The second barrier layer 206 is formed to a thickness within a range of about 300 to 1000 Angstroms.

Each of the first and second dielectric layers 204, 208 generally comprise at least one material having a dielectric constant that is less than about 4.0. Herein such materials are referred to as low-k materials. Suitable low-k materials may include carbon-doped dielectrics, such as carbon doped silicon oxide, organic doped silicon glass (OSG), fluorine doped silicon glass (FSG), and the like. Carbon doped silicon oxide such as BLACK DIAMOND™ and BLACK DIAMOND II™ are available from Applied Materials, Inc. of Santa Clara, Calif. The dielectric layers 204, 208 are generally deposited to a thickness of about 1000 to 5000 and 2000 to 10,000 Angstroms, respectively. The capping layer 209 is generally formed to a thickness of about 300 to 1000 Angstroms from an oxide, such as silicon dioxide ($SiO_2$).

The conductive line 216 may be formed from a metal (e.g., copper (Cu), aluminum (Al), tantalum (Ta), tungsten (W), titanium (Ti), and the like) or a conductive compound (e.g., tantalum nitride (TaN), titanium nitride (TiN), tungsten nitride (WN), and the like). In one exemplary embodiment, the conductive line layer is formed from copper (Cu) to a thickness of about 1000 to 5000 Angstroms.

The sacrificial layer 210 is formed from a material that, during a polishing process (e.g., chemical-mechanical polishing (CMP) process), demonstrates good polishing properties as compared to underlying material layers. Additionally, the selected material should have a high etch selectivity versus the material of the second dielectric layer 204 and the capping layer 209, e.g., low-k material. Suitable materials for the sacrificial layer 210 include amorphous silicon (Si), titanium nitride (TiN), tungsten (W), and the like. The thickness of the sacrificial layer 210 is generally about 500 to 1500 Angstroms.

In one exemplary embodiment, the mask layer 212 is formed from a photoresist layer. Alternatively, the mask 212 may be a hard mask comprised of silicon dioxide ($SiO_2$), hafnium dioxide ($HfO_2$), Advanced Patterning Film™ (APF) (available from Applied Materials, Inc. of Santa Clara, Calif.), and the like.

Additionally, the mask layer 212 may include an anti-reflective coating (ARC) 205 (shown in broken line) that controls the reflection of light used to expose the photoresist during a subsequent lithographic patterning process (discussed in reference to step 104). As feature sizes are reduced, inaccuracies in an etch mask pattern transfer process can arise from optical limitations that are inherent to the lithographic process, such as light reflection. The anti-reflective coating (ARC) 205 may comprise an organic anti-reflective coating (OARC) (e.g., polyamide, and the like) or a dielectric anti-reflective coating (DARC) (e.g., silicon nitride (SiN), and the like).

Processes for applying the mask 214 are described in commonly assigned U.S. patent application Ser. No. 10/245, 130, filed Sep. 16, 2002 and Ser. No. 09/590,322, filed Jun. 8, 2000, which are incorporated herein by reference.

Layers comprising the film stack 201 may be formed using any conventional thin film deposition technique, such as atomic layer deposition (ALD), physical vapor deposition (PVD), chemical vapor deposition (CVD), plasma enhanced CVD, and the like. Fabrication of the dual damascene interconnect structure may be performed using the respective processing reactors of CENTURA®, ENDURA®, ELECTRA®, MIRRA®, and other semiconductor wafer processing systems available from Applied Materials, Inc. of Santa Clara, Calif.

At step 104, a patterned mask 214 is formed on the sacrificial layer 210 (FIG. 2B). The mask 214 is formed in the mask layer 212 and defines the location and topographic dimensions of a trench 218 of the dual damascene interconnect structure being formed using the sequence 100. Specifically, the mask 214 protects regions 221 and 222 and exposes region 220 of the wafer 200. The mask 214 may be formed using a conventional lithographic patterning process. During the patterning process, the photoresist layer 212 is exposed through a patterned reticle, developed, and then the undeveloped portion of the photoresist layer is removed. The remaining developed photoresist is generally a polymer that forms the mask 214.

At step 106, the anti-reflective coating (ARC) 205, the sacrificial layer 210, the capping layer 209 (if applicable) and the second dielectric layer 208 are plasma etched in the region 220 (FIG. 2C). In the depicted embodiment, step 106 forms in the second dielectric layer 208 the trench 218 having a pre-determined depth 229. Step 106 uses the mask 214 as an etch mask, and an endpoint detection system of the etch reactor may use control of process time, laser interferometry, and the like to determine the etch depth of the etch process. In one embodiment, step 106 uses a fluorocarbon-containing gas (or gas mixture) comprising for example carbon tetrafluoride ($CF_4$), difluoromethane ($CH_2F_2$), nitrogen ($N_2$), and one or more diluant gases, such as argon (Ar) or carbon monoxide (CO).

Step 106 can be performed, for example, using the etch module of the CENTURA® system. The etch module is a dual frequency capacitive etch reactor providing independent control of ion energy, plasma density and neutral species distribution uniformity, wafer temperature and is adapted for processing 300 mm wafers. In one embodiment, the reactor uses a very high frequency (VHF) plasma source (e.g., 160 MHz plasma source), at least one magnetizing solenoid, and a 13.56 MHz wafer support pedestal (cathode) biasing source. The etch module is disclosed in detail in U.S. patent application Ser. No. 10/192,271, filed Jul. 9, 2002, which is herein incorporated by reference. Salient features of the etch module are discussed below with reference to FIG. 5.

In one illustrative embodiment, the anti-reflective coating (ARC) 205 comprising silicon nitride ($Si_3N_4$), the sacrificial layer 210 comprising amorphous silicon, the capping layer 209 comprising silicon dioxide ($SiO_2$) and the second dielectric layer 208 comprising organic doped silicon glass are etched using the etch module by providing a fluorocarbon-containing gas mixture comprising carbon tetrafluoride ($CF_4$) at a flow rate of 40 to 80 sccm, nitrogen ($N_2$) at a flow rate of 120 to 160 sccm (i.e., a $CF_4:N_2$ flow ratio ranging from 1:4 to 2:3), argon (Ar) at a flow rate of 500 to 1500 sccm or carbon monoxide (CO) at a flow rate of 0 to 100 sccm, applying to at least one solenoid of about 0 to 15 Amps direct current, applying a source power of between about 0 and 300 W to the upper electrode, applying a cathode bias power of between about 2000 and 3000 W, and maintaining a wafer pedestal temperature of about 10 to 40 degrees Celsius at a chamber pressure of between about 10 and 50 mTorr. One illustrative etch process uses carbon tetrafluoride ($CF_4$) at a flow rate of 65 sccm, nitrogen ($N_2$) at a flow rate of 140 sccm (i.e., a $CF_4:N_2$ flow ratio of about 0.46:1), argon (Ar) at a flow rate of 500 sccm, applies 2.0 Amps direct current to one solenoid, applies 300 W of source power to the upper electrode, 2700 W of cathode bias power and maintains a wafer pedestal temperature of 20 degrees Celsius at a chamber pressure of 30 mTorr. Such a process provides etch selectivity for silicon dioxide (layer 209), amorphous silicon (layer 210) and organic doped silicon glass (layer 208) over the photoresist (mask 214) of at least 5:1, 3:1 and 3:1, respectively.

At step 108, the mask 214 and anti-reflective coating (ARC) 205 (if such ARC is an organic material) are removed, or stripped (FIG. 2D). Step 108 generally performs a stripping process using an oxygen-containing plasma e.g., oxygen ($O_2$). During stripping step 108, the sacrificial layer 210 may be used as a stop etch layer. Step 108 may be performed, e.g., using the Advanced Strip and Passivation (ASP) module or the AXIOM® reactor of the CENTURA® system. One exemplary photoresist stripping process is disclosed in U.S. patent application Ser. No. 10/245,130, filed Sep. 16, 2002.

The ASP module is a microwave downstream plasma reactor in which plasma is confined such that only reactive neutrals are allowed to enter the process chamber thereby precluding plasma-related damage of the substrate or circuits formed on the substrate. The AXIOM® reactor is a remote plasma reactor. The AXIOM® reactor is described in detail in U.S. patent application Ser. No. 10/264,664, filed Oct. 4, 2002, which is herein incorporated by reference.

At step 110, a bi-layer mask layer 226 is formed over the sacrificial layer 210 and trench 218 (FIG. 2E). Generally, the bi-layer mask layer 226 comprises an imaging film 230 (top film) and a planarizing film 228 (bottom film). The imaging film 230 may comprise either of a photoresist film or a silicon-rich photoresist film (e.g., polysiloxane, and the like) and the planarizing film 228 is generally an organic film (e.g., film of sulfonated material, polyhydroxystyrene-based cross-linkable material, and the like). For a bi-layer mask layer 226 comprising a silicon-rich photoresist film, the imaging film 230 generally has a thickness of about 500 to 1000 Angstroms and the planarizing film 228 a thickness of about 3000 to 5000 Angstroms. For a bi-layer mask 226 comprising photoresist, the imaging film 230 generally has a thickness of about 3000 to 5000 Angstroms and the planarizing film 228 has a thickness of about 500 to 2000 Angstroms.

At step 112, the mask 234 is formed in the imaging film 228 (FIG. 2F). The mask 234 defines the location and topographic dimensions of a contact hole 224 of the dual damascene interconnect structure being formed. Specifically, the mask 234 exposes region 232 corresponding to location of the contact hole 224 to be etched in the second dielectric layer 208 and protects adjacent regions of the film stack 201. The mask 234 may be formed using a conventional lithographic patterning process.

Lithographic errors accumulated during fabrication of the interconnect structure, (e.g., during patterning the first dielectric layer 204, mask layer 212, and the like) may result in misalignment 225 between locations of the trench 218 and contact hole 224. For the interconnect structure to operate properly, the misalignment 225 should be removed, as described below in reference to steps 114, 116, and 118. The mask 234 is generally registered with respect to the conductive line 216 and the misalignment 225 can be removed by etching a sidewall 227 of the trench 218.

At step 114, the planarizing film 228 is plasma etched in the region 232 (FIG. 2G). Step 114 uses a plasma etch process to transfer the image of the contact hole 224 from the mask 234 into the planarizing film 228. Directionality for such etch process may be increased by using substrate bias power. In one embodiment, step 114 continues until a thickness 236 of the planarizing film 228 at a bottom of the trench 218 reaches a pre-determined value of about 100 to 1000 Angstroms. In this embodiment, a portion 238 of the planarizing film 228 is advantageously preserved in the region 232 where, during subsequent removal of the misalignment 225, such portion may be used as an etch mask (discussed below in reference to step 116). In one illustrative embodiment, step 114 uses either an oxygen-containing gas, e.g. oxygen ($O_2$), and the like or a nitrogen-containing gas, e.g., ammonia ($NH_3$), and the like. In one embodiment, the oxygen-containing gas further comprises a hydrogen ($H_2$) and/or an inert gas, such as at least one of argon (Ar), neon (Ne), nitrogen ($N_2$), and the like.

Step 114 can be performed in an etch reactor, e.g., the etch module of the CENTURA® system. In one illustrative embodiment, the planarizing film 228 comprising the organic material is etched using the etch module by providing ammonia ($NH_3$) at a flow rate of 100 to 500 sccm, oxygen ($O_2$) at a flow rate of 0 to 100 sccm (i.e., a $NH_3:O_2$ flow ratio ranging from 1:1 to 500:0), applying to at least one solenoid about 0 to 15 Amps direct current, applying a source power of between about 1000 and 2000 W to the upper electrode, applying a cathode bias power of between about 200 and 800 W, and maintaining a wafer pedestal temperature of about −20 to 40 degrees Celsius at a chamber pressure of between about 30 and 100 mTorr. One illustrative etch process uses ammonia ($NH_3$) at a flow rate of 500 sccm, applies 13 Amps direct current to one solenoid, applies 1800 W of source power to the upper electrode, 400 W of cathode bias power and maintains a wafer temperature of 20 degrees Celsius at a chamber pressure of 50 mTorr. Such a process provides etch selectivity for the organic material (layer 228) over a photoresist (mask 234) of at least 3:1, as well as etch selectivity for the organic material over the amorphous silicon (layer 210) of at least about 10:1.

In an alternative embodiment when there is no misalignment 225 between locations of the trench 218 and contact hole 224, the etch process may continue until the planarizing film 228 is removed in the region 232, i.e., until the thickness 236 of the film 228 at a bottom of the trench 218 is reduced to zero. To determine the endpoint of the etch process, the etch reactor may use an endpoint detection system to monitor plasma emissions at a particular wavelength, laser interferometry, control of process time, and the like. In such an alternative embodiment, the sequence 100 skips steps 116, 118 and proceeds after step 114 to step 120, as illustratively shown in FIG. 1A using a link 115.

At step 116, the sidewall 227 of the trench 218 is plasma etched to remove the misalignment 225 (FIG. 2G). Step 116 uses the mask 234 and the portion 238 of the film 228 as an etch mask. In the embodiment shown, step 116 may overetch the second dielectric layer 208 and form a recess 240 in the layer 208 (FIG. 2H).

In one exemplary embodiment, step 116 is performed using the etch module and the process recipe described above with reference to step 106. To determine the endpoint of the etch process, the etch reactor may use an endpoint detection system to monitor process time, laser interferometry, and the like.

At step 118, the remaining portion 238 of the planarizing film 228 is removed (FIG. 2I). Step 118 may use the process described above with reference to step 114.

At step 120, remaining second dielectric layer 208 is plasma etched and removed in the region 232 (FIG. 2J). In one exemplary embodiment, step 120 uses the similar etchants and similar process recipes described above with reference to step 106. Step 120 may use mask 234 or film 228 as an etch mask and the second barrier layer 206 as an etch stop layer. To determine the endpoint of the etch process, the etch reactor may use an endpoint detection system to monitor process time, laser interferometry, and the like. At the end of step 120, mask 234 is generally completely removed.

One illustrative etch process for the second dielectric layer 208 comprising a BLACK DIAMOND™-like film provides butylfluoride ($C_4F_8$) at a flow rate of 16 sccm, nitrogen ($N_2$) at a flow rate of 200 sccm (i.e., a $C_4F_8:N_2$ flow ratio of about 1:12.5), argon (Ar) at a flow rate of 200 sccm, applies 4 Amps direct current to one solenoid, applies 3000 W of bias power and maintains a wafer pedestal temperature of 20 degrees Celsius at a chamber pressure of 20 mTorr. Such a process etches mask 234 and provides etch selectivity for organic doped silicon glass (layer 208) over the planarizing film (layer 228), amorphous silicon (layer 210) and silicon dioxide (capping layer 209) of at least 3:1.

At step 122, residues of mask 234 and the underlying planarizing film 228 are plasma etched and removed from the substrate 200 (FIG. 2K). Step 122 may use a gas mixture comprising an oxygen-containing gas (e.g., oxygen ($O_2$)) and/or a nitrogen-containing gas (e.g., ammonia ($NH_3$)). Such etch process may be performed using, e.g., the etch module.

In one illustrative embodiment, residues of mask 234 comprising silicon-rich photoresist and the planarizing film 228 comprising an organic material are etched using the etch module by providing oxygen ($O_2$) at a flow rate of 100 to 500 sccm, ammonia ($NH_3$) at a flow rate of 0 to 100 sccm (i.e., a $O_2:NH_3$ flow ratio ranging from 500:1 to 1:0), applying to at least one solenoid about 0 to 15 Amps direct current, applying a source power of between about 0 and 2000 W to the upper electrode, applying a cathode bias power of between about 0 and 200 W and maintaining a wafer pedestal temperature of about 0 to 20 degrees Celsius at a chamber pressure of between about 10 and 100 mTorr. One illustrative etch process provides oxygen ($O_2$) at a flow rate of 500 sccm, applies 0.5 Amps direct current to one solenoid, applies 800 W of source power to the upper electrode, 100 W of cathode bias power and maintains a wafer pedestal temperature of 20 degrees Celsius at a chamber pressure of 10 mTorr. Such a process provides etch selectivity for residues of the silicon-rich photoresist (layer 234) and the organic material (layer 228) over the organic doped silicon glass (layer 208) of at least 10:1 and 10:1, and over the BLOK-II™ or BLOK-III™ materials (layer 206) of about 10:1 and 10:1, respectively.

At step 124, the second barrier layer 206 is plasma etched and removed in the region 232 thereby forming the contact hole 224 (FIG. 2L). In one embodiment, step 124 uses a gas mixture comprising carbon tetrafluoride ($CF_4$) and oxygen ($O_2$). Step 124 may use the second dielectric layer 208 as an etch mask and the conductive layer 216 (e.g., copper layer) as an etch stop layer. To determine the endpoint of the etch process, the etch reactor may use an endpoint detection system to monitor process time, laser interferometry, and the like.

In one illustrative embodiment, the barrier layer 206 comprising the BLOK-II™ or BLOK-III™ material is etched using the etch module by providing carbon tetrafluoride ($CF_4$) at a flow rate of 10 to 100 sccm, oxygen ($O_2$) at a flow rate of 1 to 10 sccm (i.e., a $CF_4:O_2$ flow ratio ranging from 100:1 to 1:1), nitrogen ($N_2$) at a flow rate of 0 to 100 sccm or difluoromethane ($CH_2F_2$) at a flow rate of 0 to 50 sccm, applying to at least one solenoid about 0 to 15 Amps direct current, applying a source power of between about 0 and 500 W to the upper electrode, applying a cathode bias power of between about 100 and 500 W, and maintaining a wafer pedestal temperature of about 0 to 40 degrees Celsius at a chamber pressure of between 10 and 50 mTorr. One illustrative etch process provides carbon tetrafluoride ($CF_4$) at a flow rate of 50 sccm, oxygen ($O_2$) at a flow rate of 10 sccm (i.e., a $CF_4:O_2$ flow ratio of about 5:1), applies 4.0 Amps direct current to one solenoid, applies 300 W of bias power and maintains a wafer pedestal temperature of 20 degrees Celsius at a chamber pressure of 20 mTorr. Such a process provides etch selectivity for the BLOK-II™ or BLOK-III™ material (layer 206) over the amorphous silicon (layer 210) and the organic doped silicon glass (layer 208) of at least 2:1 and 2:1, respectively.

At step 126, a post-etch treatment (PET) process is performed to clean any remaining polymer or post-etch residues remaining on the etched features and in the contact hole. In one illustrative embodiment, the post-etch treatment process is performed using the etch module by providing oxygen ($O_2$) at a flow rate of 100 to 500 sccm, hydrogen ($H_2$) at a flow rate of 10 to 300 sccm (i.e., a $O_2:H_2$ flow ratio ranging from 10:1 to 5:3), or ammonia ($NH_3$) at a flow rate of 10 to 300 sccm, applying a source power of between about 100 and 1000 W to the upper electrode, applying a cathode bias power of between about 10 and 300 W, and maintaining a wafer pedestal temperature of about 0 to 40 degrees Celsius at a chamber pressure of between 10 and 50 mTorr. One illustrative etch process provides oxygen ($O_2$) at a flow rate of 300 sccm, oxygen ($H_2$) at a flow rate of 100 sccm (i.e., a $O_2:H_2$ flow ratio of about 3:1), applies 800 W of source power to the upper electrode, applies 100 W of bias power and maintains a wafer pedestal temperature of 20 degrees Celsius at a chamber pressure of 20 mTorr. The post-etch treatment may be performed for up to about 5 minutes.

At step 128, the trench 218 and contact hole 224 are metallized (FIG. 2M). In one embodiment, step 128 uses copper to metallize the trench 218 and contact hole 224 and to form a conductive layer 244. A copper metallization process is well known in the art. During the metallization process (e.g., an electroplating process), a metal (e.g., copper) fills trenches and contact holes in an inter-metal dielectric (IMD) layer (i.e., layer 208), as well as covers adjacent regions of the substrate 200 forming a sub-layer 242 (shown in broken line) of excessive metal.

At step 130, the sub-layer 242 is removed and the capping layer 209 (if present) or the second dielectric layer 208 is planarized (FIG. 2N). A planarization process (e.g., chemical-mechanical polishing (CMP) process) firstly removes the excessive metal (i.e., sub-layer 242) and then removes the sacrificial layer 210. During removal of the sub-layer 242, the sacrificial layer 210 protects the underlying capping layer 209 (if present) or the second dielectric layer 208 (e.g., low-k dielectric layer) from damage, such as erosion, cracking, peeling, and the like. After the planarization process, a remaining portion of the conductive layer 244 forms an interconnect conductor 246 embedded in the second dielectric layer 208, and fabrication of the dual damascene interconnect structure is completed.

At step 132, the sequence 100 ends.

Figure 3A:
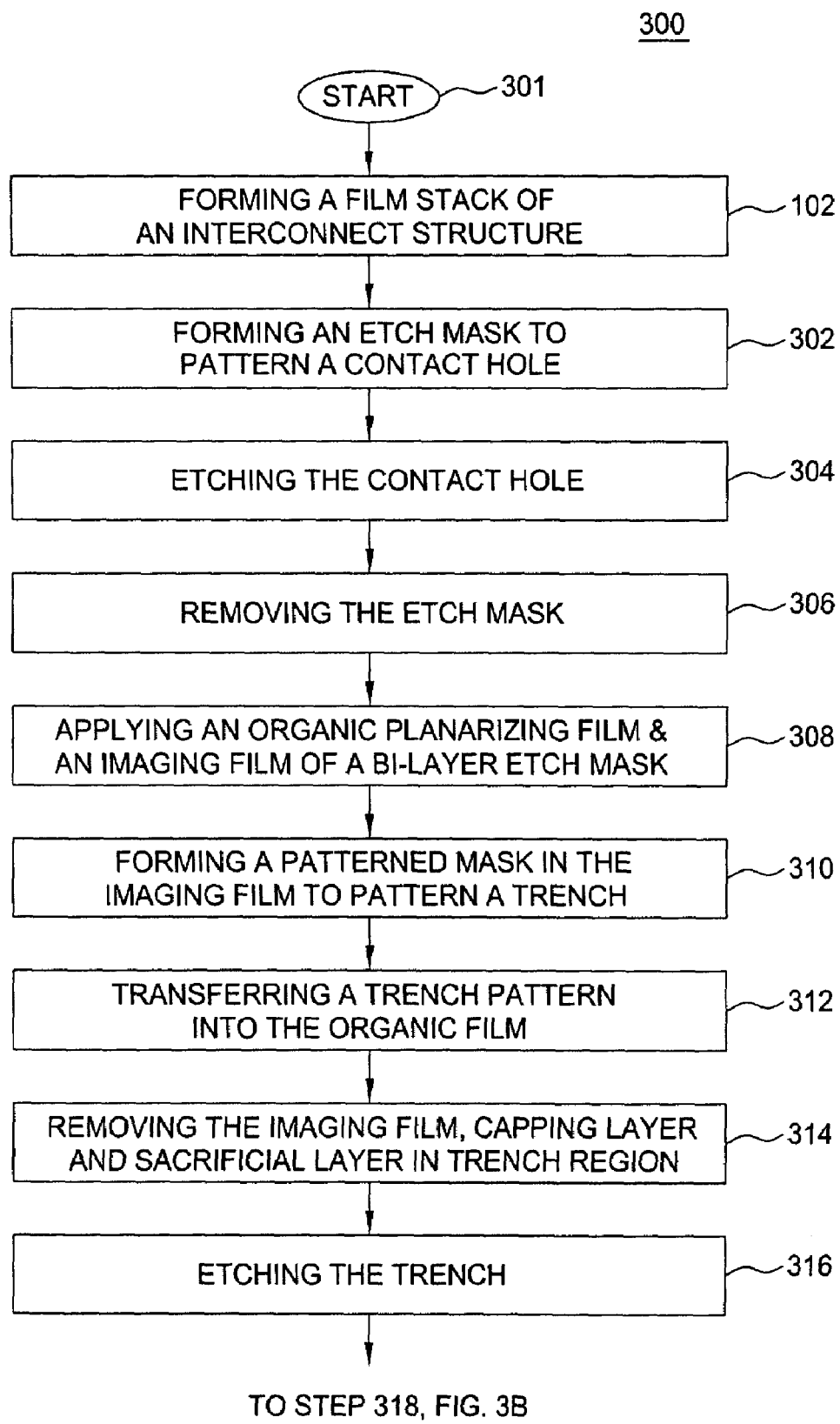
FIGS. 3A–3B depict a flow diagram of a method of fabricating a dual damascene interconnect structure in accordance with an alternative embodiment of the present invention.
Figure 3B:
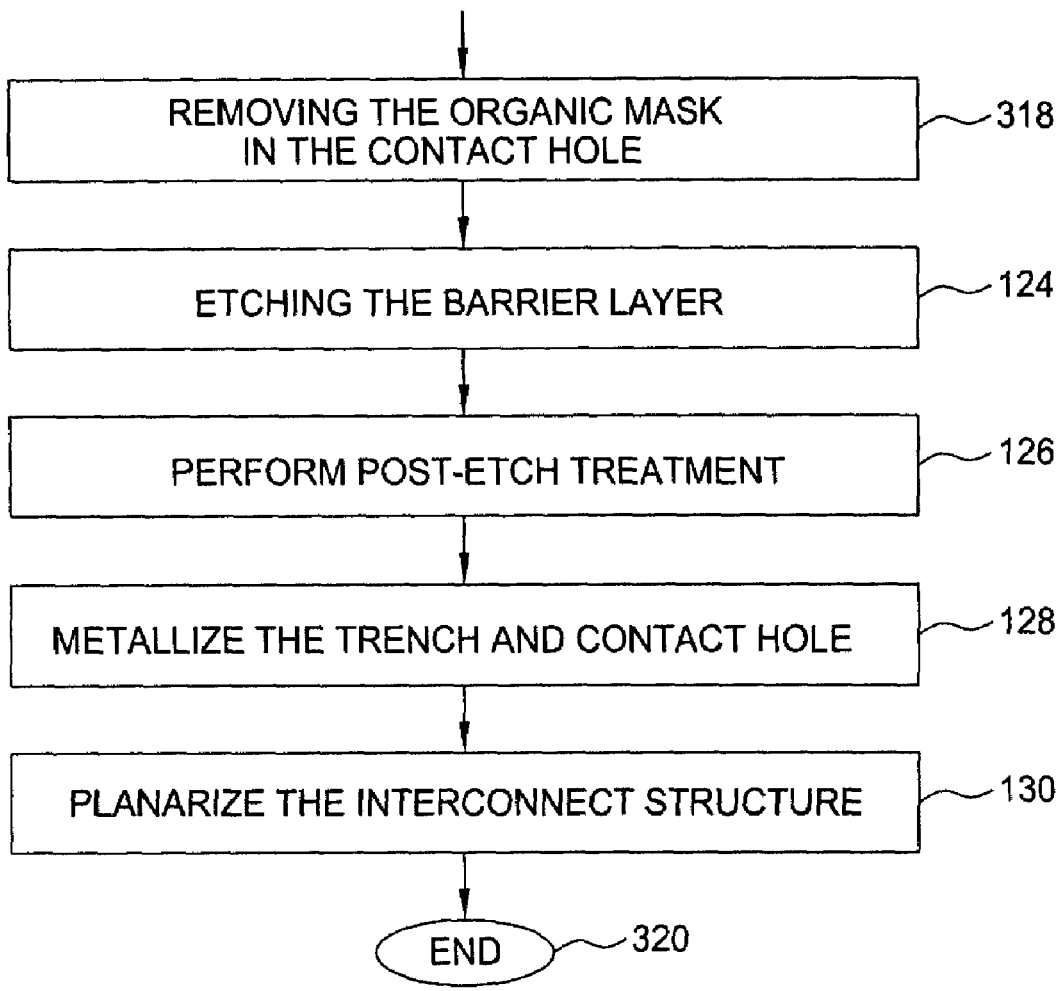

One alternative embodiment of the inventive method of fabricating a dual damascene interconnect structure is depicted in FIGS. 3A–3B as sequence 300. The sequence 300 comprises the processes that are performed upon a film stack during fabrication of the dual damascene interconnect structure.

FIGS. 4A–4I depict a sequence of schematic, cross-sectional views of a substrate having a dual damascene interconnect structure being fabricated using the sequence 300. The views in FIGS. 4A–4I relate to individual processing steps used to form the interconnect structure. To best understand the invention, the reader should simultaneously refer to FIGS. 3A–3B and FIGS. 4A–4I. Similar to FIGS. 1A–1B and FIGS. 2A–2N, sub-processes and lithographic routines are not shown in FIGS. 3A–3B and FIGS. 4A–4I. The images in FIGS. 4A–4I are not depicted to scale and are simplified for illustrative purposes.

The sequence 300 starts at step 301, performs step 102 of the sequence 100 (described above in reference to FIG. 2A) and proceeds to step 302.

Figure 4A:
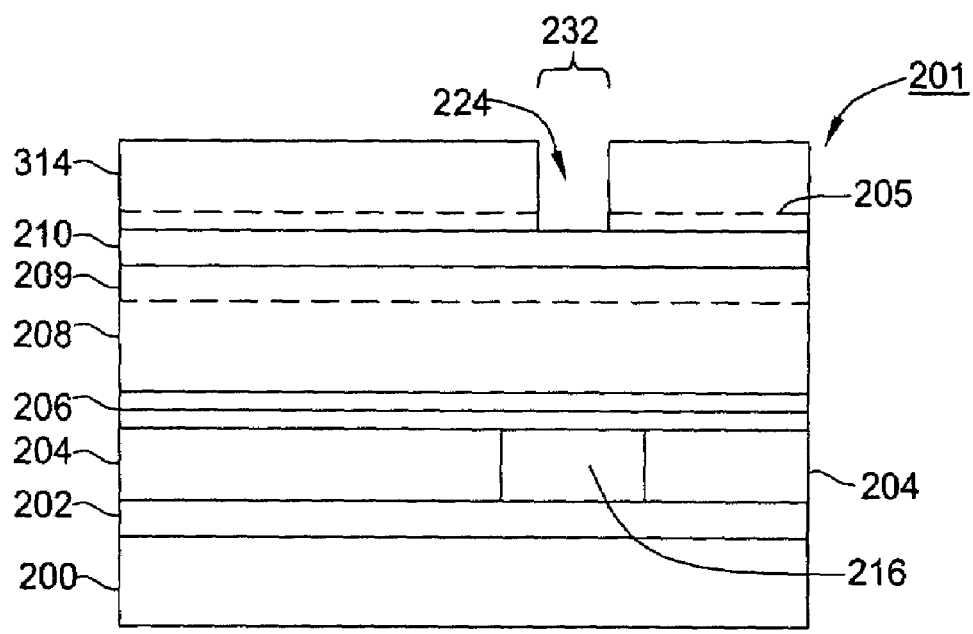
FIGS. 4A–4I depict a sequence of schematic, cross-sectional views of a substrate having a dual damascene interconnect structure being formed in accordance with the method of FIGS. 3A–3B.

At step 302, a patterned mask 314 is formed on the sacrificial layer 210 (FIG. 4A). The mask 314 defines the location and topographic dimensions of the contact hole 224 of the dual damascene interconnect structure being formed. Specifically, the mask 314 exposes region 232 of the film stack 201. The mask 314 may be formed using, e.g., the processes described above in reference to the mask 214.

Figure 4B:
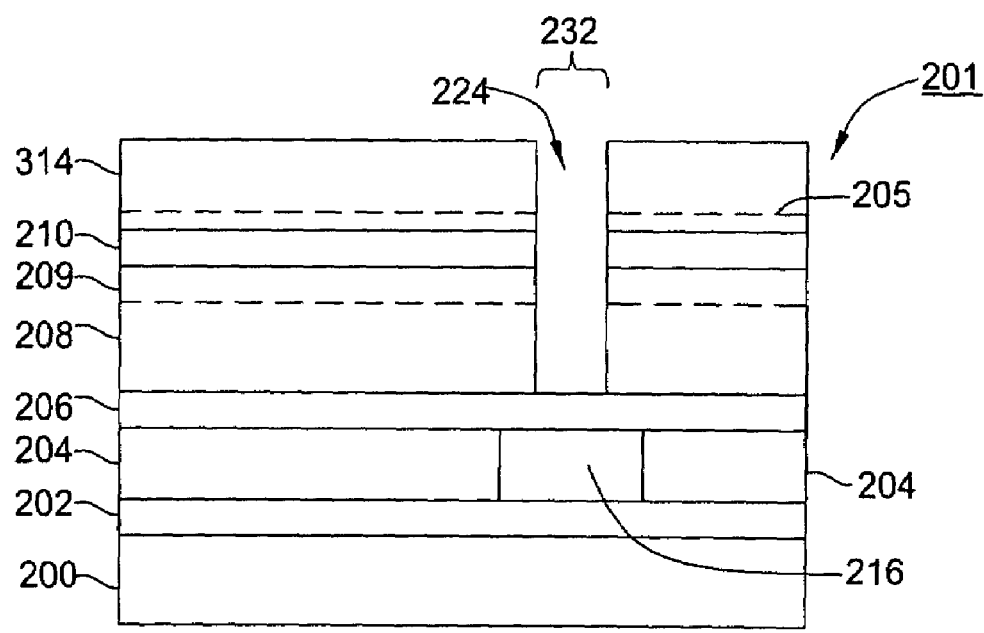
Figure 4C:
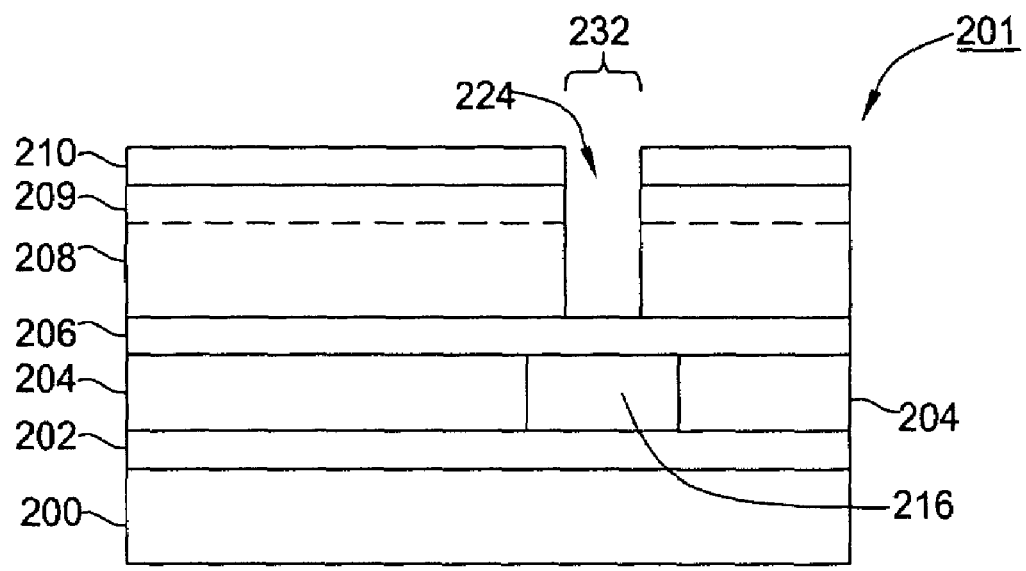

At step 304, the sacrificial layer 210, the capping layer 209 and the second dielectric layer 208 are plasma etched in the region 232 (FIG. 4B). Step 304 may use the mask 214 as an etch mask and the second barrier layer 206 as an etch stop layer. In one exemplary embodiment, step 304 is performed using the process described above in reference to step 120 of sequence 100. Alternatively, step 304 may be is performed using the process described above in reference to step 106 of the sequence 100.

At step 306, the mask 314 is stripped (FIG. 4C) using, e.g., the process described above in reference to step 108 of the sequence 100.

Figure 4D:
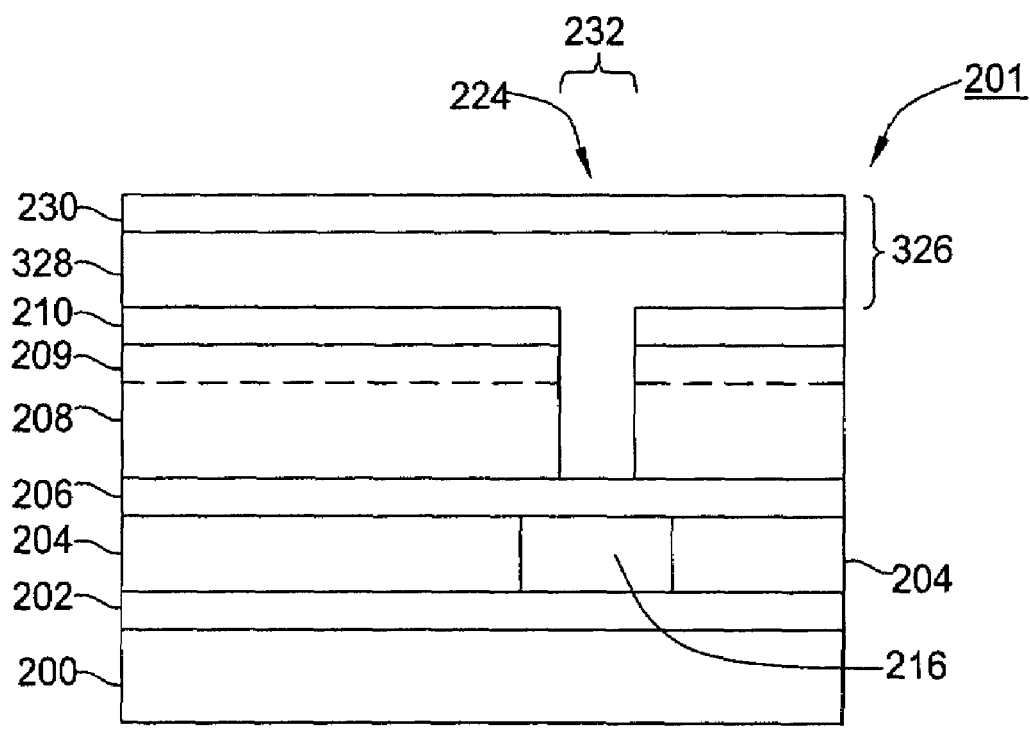

At step 308, a bi-layer mask film 326 is formed over the sacrificial layer 210 and contact hole 224 (FIG. 4D). The bi-layer mask film 326 comprises the imaging film 230 formed from silicon-rich photoresist and an organic planarizing film 328. The films of bi-layer mask film 326 may be applied using the process described above with reference to the bi-layer mask layer 226 described in step 110 of the sequence 100.

Figure 4E:
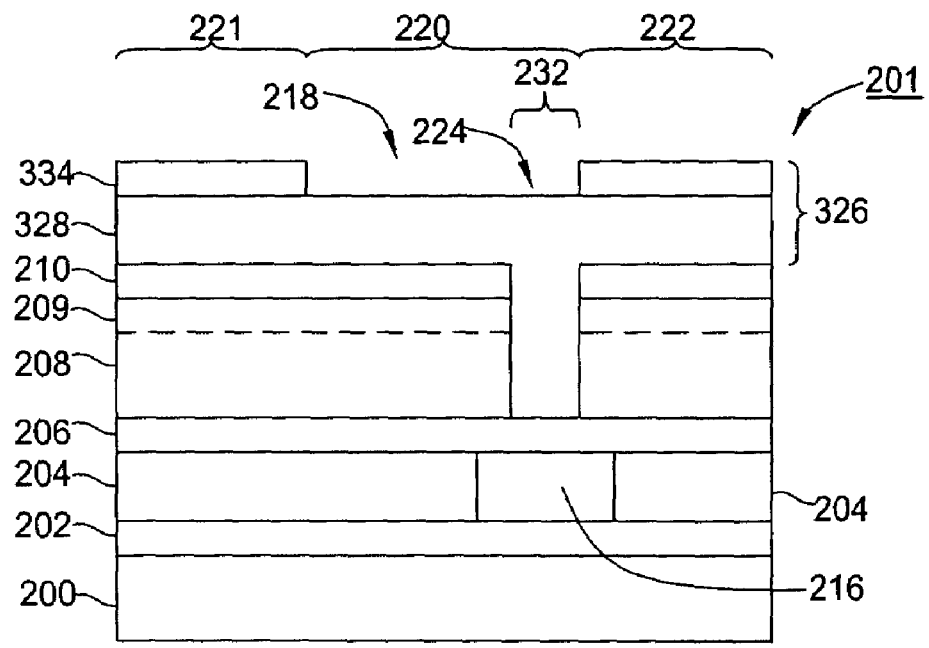

At step 310, mask 334 is formed on the planarizing film 328 (FIG. 4E). The mask 234 is formed from the imaging film 230 and defines the location and topographic dimensions of the trench 218 of the dual damascene interconnect structure being formed. Specifically, the mask 334 exposes region 220 corresponding to location of the trench 218 and protects adjacent regions 221 and 222 of the film stack 201. The mask 334 may be formed using the processes described above with reference to the mask 234 described in step 112 of the sequence 100.

Figure 4F:
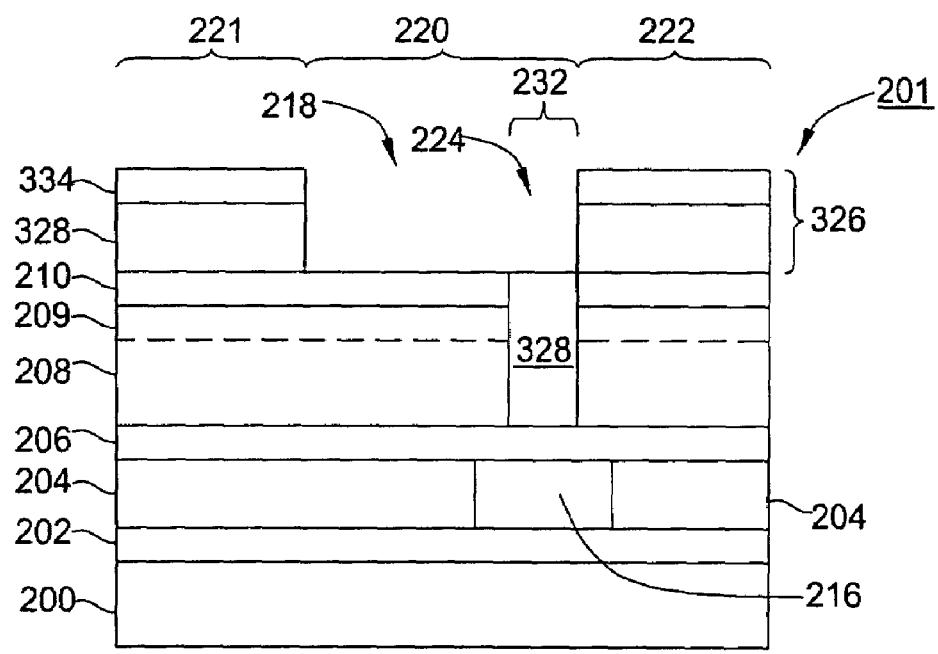

At step 312, the image of the trench 218 is transferred from the imaging film 230 into the planarizing film 328 (FIG. 4F). Step 312 may be performed using, e.g., the etch module and the process recipe described above with reference to step 114 of the sequence 100.

Figure 4G:
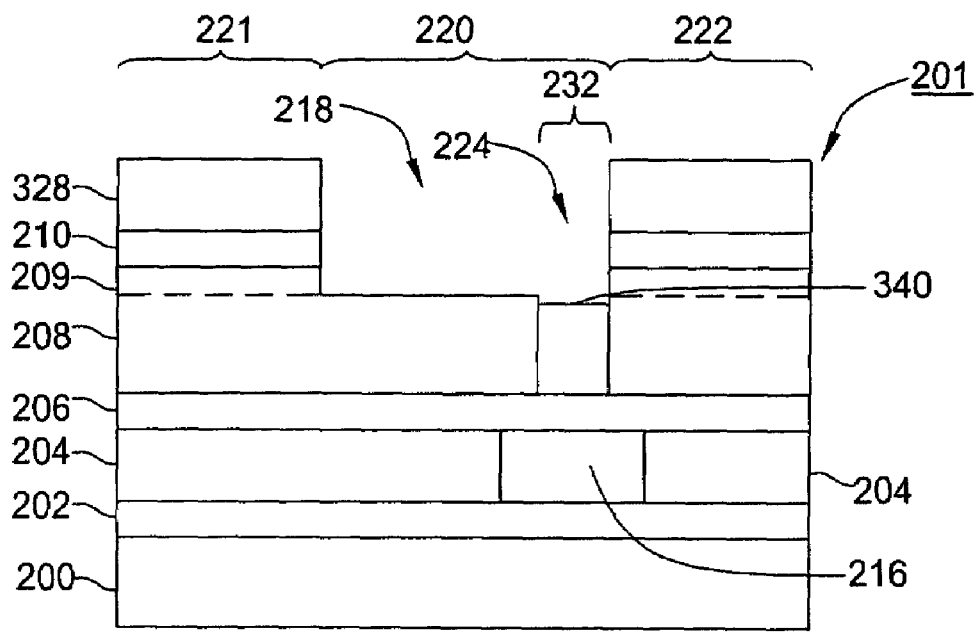

At step 314, the imaging film 230, sacrificial layer 210 and capping layer 209 are plasma etched and removed in the regions 221, 222 (film 230) and region 220 (layers 209 and 210) (FIG. 4G). Step 314 may use the second dielectric layer 208 as an etch stop layer. In one exemplary embodiment, step 314 uses a gas mixture comprising carbon tetrafluoride ($CF_4$), oxygen ($O_2$), nitrogen ($N_2$) and argon (Ar). Step 314 can be performed using, e.g., the etch module. Due to relatively low etch selectivity of the etch process for material of the sacrificial layer 210 over the silicon-rich photoresist (film 230), step 314 may form a recess 340 in the region 232 (i.e., contact hole 224).

In one illustrative embodiment, the imaging film 230 comprising silicon-rich photoresist, the capping layer 209 comprising silicon dioxide and the sacrificial layer 210 comprising amorphous silicon are etched using the etch module under the same conditions described above in step 106.

Figure 4H:
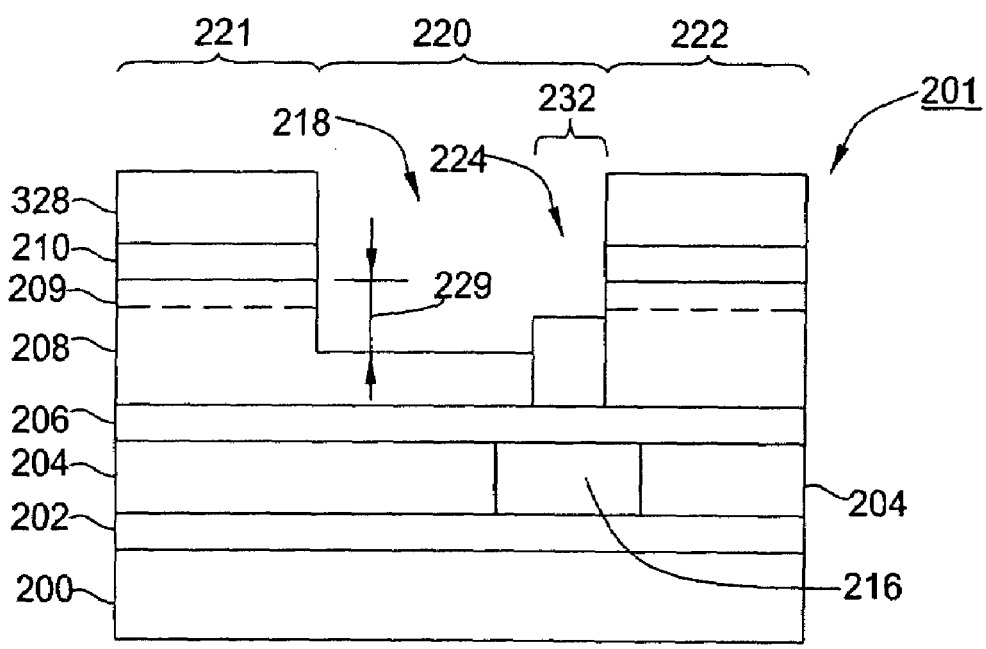

At step 316, the second dielectric layer 208 is plasma etched in the region 220 (FIG. 4H). In the embodiment shown, step 316 forms in the second dielectric layer 208 the trench 218 having the pre-determined depth 229. Step 316 uses the planarizing film 328 as an etch mask and an endpoint detection system of the etch reactor may use control of process time, laser interferometery, and the like to determine the etch depth of the etch process. In one embodiment, step 316 uses the process recipe described above with reference to step 106 of the sequence 100.

Figure 4I:
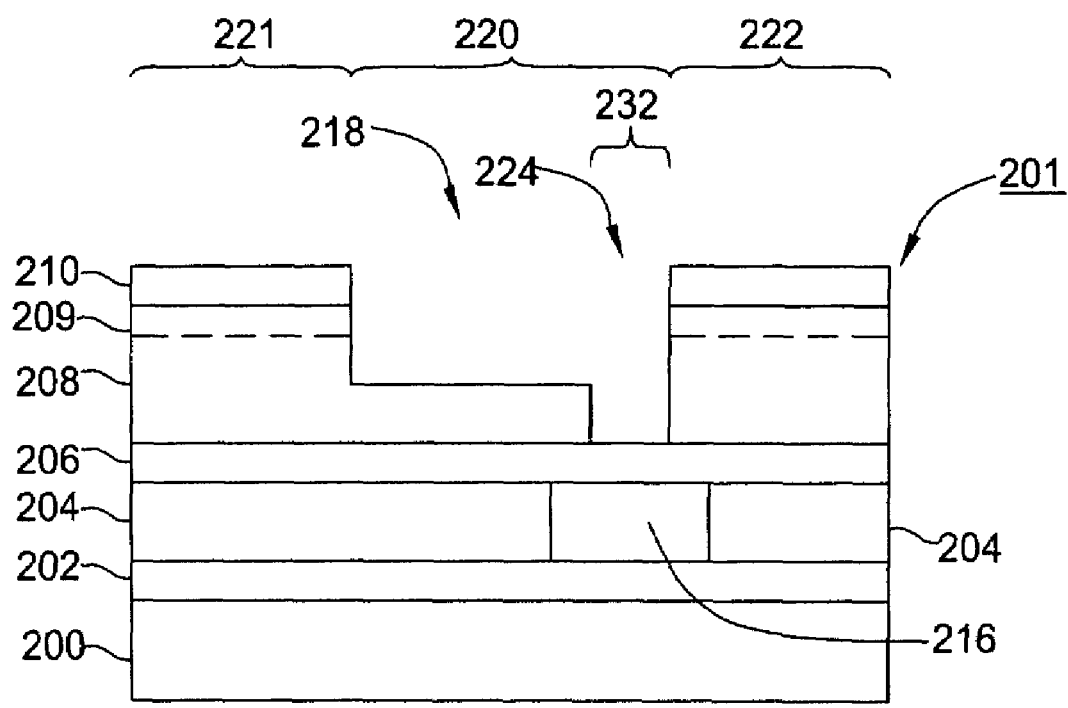

At step 318, the planarizing film 328 is removed (FIG. 4I). In one embodiment, step 318 may be performed using the process described above with reference to step 122 of the sequence 100.

Upon completion of step 318, the sequence 300 performs steps 124, 126, 128, and 130 of the sequence 100 as described above with reference to FIGS. 2L–2N. At step 320, the sequence 300 ends.

Figure 5:
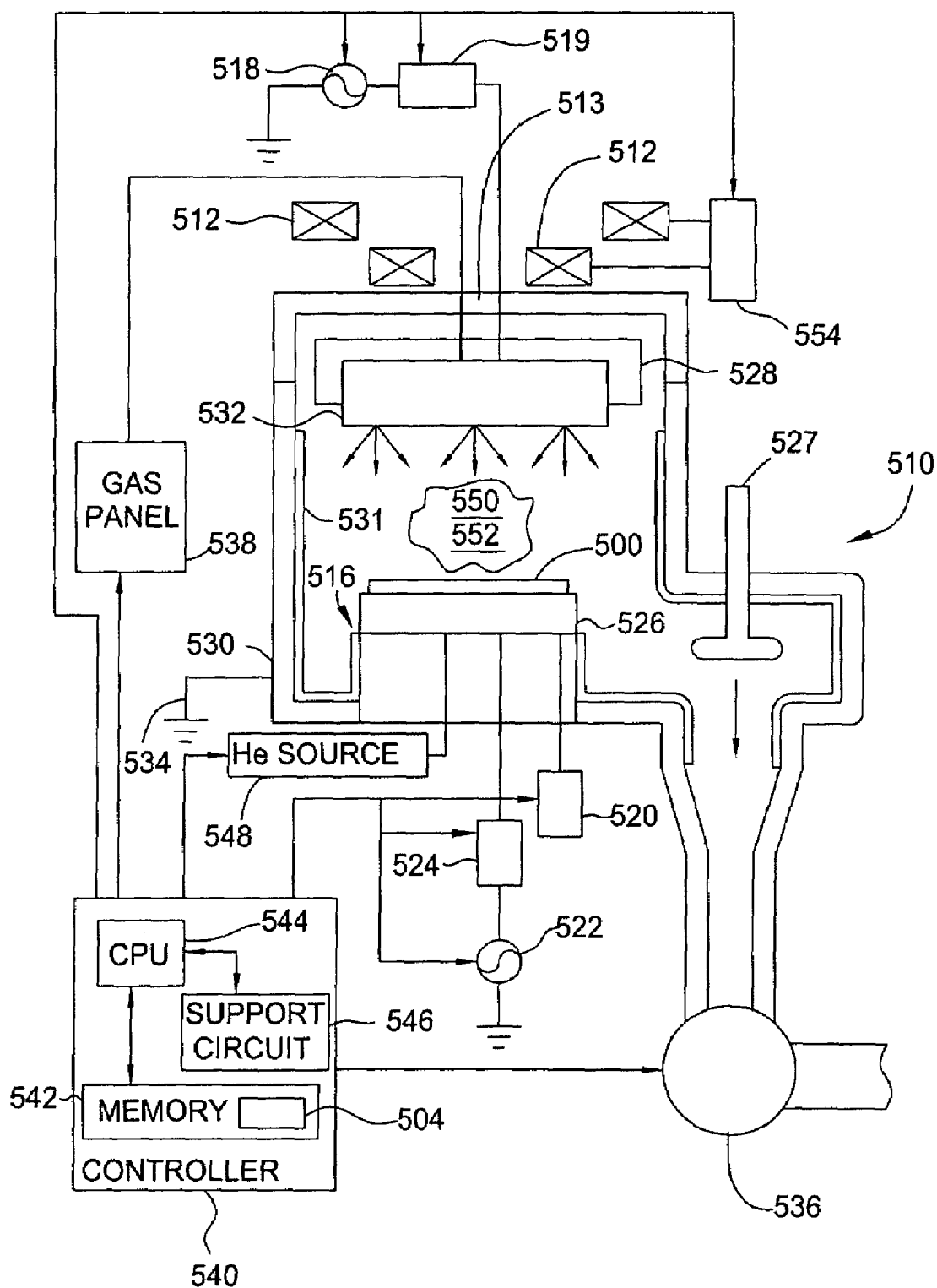
FIG. 5 depicts a schematic diagram of an exemplary plasma processing apparatus of the kind used in performing portions of the inventive method.

FIG. 5 depicts a schematic diagram of a dual frequency capacitive plasma reactor 502 that may be used to practice portions of the present invention. One such plasma reactor is the etch module that may be included in a semiconductor wafer processing system, such as the CENTURA® system commercially available from Applied Materials, Inc. of Santa Clara, Calif.

The etch module is adapted for processing 300 mm wafers, provides independent control of ion energy, plasma density and neutral species distribution uniformity, and wafer temperature, operates in broad ranges of the process parameters and etchant chemistries, may use an endpoint detection system, and has in-situ self-cleaning capabilities. In one embodiment, the etch module uses a 160 MHz plasma source to produce a high density plasma, a 13.56 MHz wafer bias source, and at least one plasma magnetizing solenoid. A detailed description of the etch module is provided in commonly assigned U.S. patent application Ser. No. 10/192,271, filed Jul. 9, 2002, which is herein incorporated by reference. Salient features of the etch module are briefly discussed below.

A reactor 502 comprises a process chamber 510 having a conductive chamber wall 530 that is connected to an electrical ground 534 and at least one solenoid segment 512 positioned exterior to the chamber wall 530. The chamber wall 530 comprises a ceramic liner 531 that facilitates cleaning of the chamber 510. The byproducts and residue of the etch process are readily removed from the liner 531 after each wafer is processed. The solenoid segment(s) 512 are controlled by a DC power source 554. The process chamber 510 also includes a wafer support pedestal 516 that is spaced apart from a showerhead 532. The wafer support pedestal 516 comprises an electrostatic chuck 526 for retaining a substrate 500 beneath the showerhead 532. The showerhead 532 may comprise a plurality of gas distribution zones such that various gases can be supplied to the chamber 510 using a specific gas distribution gradient. The showerhead 532 is mounted to an upper electrode 528 that opposes the support pedestal 516. The electrode 528 is coupled to a radio-frequency (RF) source 518.

The electrostatic chuck 526 is controlled by a DC power supply 520 through a matching network 524 that is coupled to a bias source 522. The bias source 522 may be a DC or pulsed DC source. The upper electrode 528 is coupled to the RF source 518 through an impedance transformer 519 (e.g., a quarter-wavelength matching stub). The bias source 522 is generally capable of producing an RF signal having a tunable frequency of 50 kHz to 13.56 MHz and a power of between 0 and 5000 Watts. The RF source 518 is generally capable of producing a RF signal having a tunable frequency of about 160 MHz and a power between about 0 and 1000 Watts. The interior of the chamber 510 is a high vacuum vessel that is coupled through a throttle valve 527 to a vacuum pump 536.

Those skilled in the art will understand that other plasma chambers and reactors may be used to practice the invention, including a reactive ion etch (RIE) chamber, an electron cyclotron resonance (ECR) chamber, a physical vapor deposition chamber, a rapid thermal processing chamber, a decoupled plasma source chamber, an inductively coupled plasma source chamber, and the like.

In operation, the substrate 500 is placed on the support pedestal 516 and thereafter the gaseous components are supplied to the process chamber 510 from a gas panel 538 through the showerhead 532 to form a gaseous mixture 550. The gaseous mixture 550 is ignited into a plasma 552 in the process chamber 510 by applying power from the RF source 518 to the upper electrode 528. A magnetic field is applied to the plasma via the solenoid segment(s) 512, and the support pedestal 516 is biased by applying power from the bias source 522. During processing of the substrate 500, the pressure within the interior of the etch chamber 510 is controlled using the gas panel 538 and the throttle valve 527.

The temperature of the chamber wall 530 is controlled using liquid-containing conduits (not shown) that are located in and around the wall. The temperature of the substrate 500 is controlled by stabilizing the temperature of the support pedestal 516 and flowing helium (He) gas from a gas source 548 into channels that are formed by the back side of the substrate 500 and grooves in the surface of the electrostatic chuck 526. The helium gas is used to facilitate a heat transfer between the pedestal 516 and the substrate 500. The electrostatic chuck 526 is heated by a resistive heater (not shown) within the chuck body to a steady state temperature and the helium gas facilitates uniform heating of the substrate 500. Using thermal control of the chuck 526, the substrate 500 is maintained at a temperature of between 10 and 500 degrees Celsius.

To facilitate control of the chamber 510 as described above, a controller 540, which may be one of any form of a general purpose computer processor, may be used in an industrial setting for controlling various chambers and sub-processors. The controller 540 comprises a central processing unit (CPU) 544, a memory 542, and support circuits 546 for the CPU 544 and is coupled to the various components of the etch process chamber 510 to facilitate control of the etch process. The memory 542 is coupled to the CPU 544. The memory 542, or computer-readable medium, may be one or more of readily available memory such as random access memory (RAM), read only memory (ROM), floppy disk, hard disk, or any other form of digital storage, local or remote. The support circuits 546 are coupled to the CPU 544 for supporting the processor in a conventional manner. These circuits include cache, power supplies, clock circuits, input/output circuitry and subsystems, and the like. A software routine 504, when executed by the CPU 544, causes the reactor to perform processes of the present invention and is generally stored in the memory 542. The software routine 504 may also be stored and/or executed by a second CPU (not shown) that is remotely located from the hardware being controlled by the CPU 544.

The software routine 504 is executed after the substrate 500 is positioned on the pedestal 516. The software routine 504 when executed by the CPU 544, transforms the general purpose computer into a specific purpose computer (controller) 540 that controls the chamber operation such that the etching process is performed. Although the process of the present invention is discussed as being implemented as a software routine, some of the method steps that are disclosed therein may be performed in hardware as well as by the software controller. As such, the invention may be implemented in software as executed upon a computer system, in hardware as an application specific integrated circuit or other type of hardware implementation, or a combination of software and hardware.

The invention may be practiced using other semiconductor wafer processing systems wherein the processing parameters may be adjusted to achieve acceptable characteristics by those skilled in the arts by utilizing the teachings disclosed herein without departing from the spirit of the invention.

Although the forgoing discussion referred to fabrication of the dual damascene interconnect structure, fabrication of the other devices and structures that are used in the integrated circuits can benefit from the invention.

While foregoing is directed to the illustrative embodiment of the present invention, other and further embodiments of the invention may be devised without departing from the basic scope thereof, and the scope thereof is determined by the claims that follow.

What is claimed is:

1. A method of fabricating an interconnect structure, comprising:
   (a) providing a substrate having a film stack formed thereon;

(b) patterning and etching a first feature in the film stack, wherein the first feature is a trench etched in the film stack to a pre-determined depth;

(c) forming a bi-layer mask comprising an organic film and an imaging film on the film stack;

(d) patterning the bi-layer mask;

(e) etching a second feature in the film stack using the patterned bi-layer mask as an etch mask, wherein the second feature is a contact hole, and wherein a portion of the organic film in the trench is used as an etch mask so as to remove lithographic misalignment between the contact hole and the trench when the contact hole is etched; and (f) metallizing the first and second features to form the interconnect structure.

2. The method of claim 1 wherein the film stack comprises a first barrier layer, a conductive layer embedded in a first dielectric layer, a second barrier layer and a second dielectric layer.

3. The method of claim 2 wherein at least one of a capping layer and a sacrificial layer is formed on the second dielectric layer.

4. The method of claim 3 wherein the sacrificial layer comprises at least one of amorphous silicon, titanium nitride (TiN) and tungsten (W).

5. The method of claim 2 wherein the first dielectric layer and the second dielectric layer each comprise at least one of carbon doped silicon oxide, organic doped silicon glass and fluorine doped silicon glass.

6. The method of claim 2 wherein the first barrier layer comprises at least one of silicon dioxide ($SiO_2$) and silicon nitride ($Si_3N_4$).

7. The method of claim 2 wherein the second barrier layer comprises silicon carbide (SiC).

8. The method of claim 2 wherein the conductive layer comprises at least one of copper (Cu), aluminum (Al), tantalum (Ta), tungsten (W), titanium (Ti), tantalum nitride (TaN) and titanium nitride (TiN).

9. The method of claim 1 wherein step (b) comprises:
etching the trench in the film stack comprising a dielectric material to a predetermined depth by providing carbon tetrafluoride ($CF_4$) and nitrogen ($N_2$) at a $CF_4$:$N_2$ flow ratio in a range from 1:4 to 2:3.

10. The method of claim 1 wherein step (e) comprises:
etching the contact hole in the organic layer to a pre-determined depth by providing ammonia ($NH_3$) and oxygen ($O_2$) at a flow ratio of $NH_3$:$O_2$ in a range from 1:1 to 100 percent ammonia.

11. The method of claim 3 wherein both a capping layer and a sacrificial layer are formed on the second dielectric layer and further comprising a step of planarizing the metallized interconnect structure to remove the sacrificial layer and at least a portion of the capping layer.

12. A method of fabricating an interconnect structure, comprising:

(a) providing a substrate having a film stack formed thereon;

(b) patterning and etching a first feature in the film stack, wherein the first feature is a contact hole etched in the film stack to a pre-determined depth;

(c) forming a bi-layer mask comprising an organic film and an imaging film on the film stack;

(d) patterning the bi-layer mask;

(e) etching a second feature in the film stack using the patterned bi-layer mask as an etch mask, wherein the second feature is a trench, wherein a portion of the organic material in the contact hole is used as an etch mask when the trench is formed in the film stack; and (f) metallizing the first and second features to form the interconnect structure.

13. The method of claim 12 wherein the first feature is a trench and the second feature is a contact hole.

14. The method of claim 12 wherein the first feature is a contact hole and the second feature is a trench.

15. The method of claim 12 wherein step (b) comprises:
etching the contact hole in the film stack comprising a dielectric material to a pre-determined depth by providing carbon tetrafluoride ($CF_4$) and nitrogen ($N_2$) at a $CF_4$:$N_2$ flow ratio in a range from 1:4 to 2:3.

16. The method of claim 12 wherein step (e) comprises:
etching the trench in the organic layer to a pre-determined depth by providing ammonia ($NH_3$) and oxygen ($O_2$) at a flow ratio of $NH_3$:$O_2$ in a range from 1:1 to 100 percent ammonia.

17. A method of fabricating an interconnect structure, comprising:

(a) providing a substrate having a film stack formed thereon;

(b) patterning and etching a first feature in the film stack;

(c) forming a bi-layer mask comprising an organic film and an imaging film on the film stack;

(d) patterning the bi-layer mask;

(e) etching a second feature in the film stack using the patterned bi-layer mask as an etch mask, wherein a portion of the organic film in the first feature is used as an etch mask so as to remove lithographic misalignment between the second feature and the first feature when the second feature is etched; and (f) metallizing the first and second features to form the interconnect structure.

18. The method of claim 17, wherein the trench is etched to a pre-determined depth in the film stack.

19. The method of claim 17, wherein the contact hole is etched to a pre-determined depth in the film stack.

20. The method of claim 17, wherein the first feature is a trench and the second feature is a contact hole.

21. The method of claim 17, wherein the first feature is a contact hole and the second feature is a trench.

* * * * *